(12) United States Patent
Sung

(10) Patent No.: US 7,011,134 B2
(45) Date of Patent: *Mar. 14, 2006

(54) CASTING METHOD FOR PRODUCING SURFACE ACOUSTIC WAVE DEVICES

(76) Inventor: Chien-Min Sung, No. 4, Lane 32, Chung-Cheng Road, Tansui, Taipei County, Taiwan Province, 23911 (TW)

( * ) Notice: Subject to any disclaimer, the term of this patent is extended or adjusted under 35 U.S.C. 154(b) by 275 days.

This patent is subject to a terminal disclaimer.

(21) Appl. No.: 10/421,369

(22) Filed: Apr. 22, 2003

(65) Prior Publication Data

US 2004/0031438 A1 Feb. 19, 2004

Related U.S. Application Data

(63) Continuation-in-part of application No. 10/002,395, filed on Oct. 19, 2001, now Pat. No. 6,814,130, which is a continuation-in-part of application No. 09/687,444, filed on Oct. 13, 2000, now Pat. No. 6,659,161.

(51) Int. Cl.
*B22D 27/00* (2006.01)
*C23C 16/27* (2006.01)

(52) U.S. Cl. .................. 164/74; 264/29.1; 427/133; 427/135; 427/249.8

(58) Field of Classification Search .................. 164/74; 264/29.1; 427/133, 135, 249.8
See application file for complete search history.

(56) References Cited

U.S. PATENT DOCUMENTS

| 4,952,832 A | 8/1990 | Imai et al. |
| 4,981,818 A | 1/1991 | Anthony et al. |
| 5,130,111 A | 7/1992 | Pryor |
| 5,173,089 A | 12/1992 | Tanabe et al. |
| 5,186,785 A | 2/1993 | Annamalia |
| 5,329,208 A | 7/1994 | Imai et al. |
| 5,355,568 A | 10/1994 | Imai et al. |
| 5,366,579 A | 11/1994 | Yamazaki et al. |
| 5,374,293 A | 12/1994 | Takashita et al. |
| 5,380,349 A | 1/1995 | Taniguchi et al. |
| 5,391,895 A | 2/1995 | Dreifus |
| 5,402,029 A | 3/1995 | Nakamura et al. |
| 5,440,189 A | 8/1995 | Nakahata et al. |
| 5,562,769 A | 10/1996 | Dreifus et al. |

(Continued)

FOREIGN PATENT DOCUMENTS

EP 0 930 702 7/1999

(Continued)

OTHER PUBLICATIONS

Choi K.H. et al., "Effect of Dielectric Layer in ZnO/Dielectric/Si Layered Structure on GSAW and HVPSAW Propagation Properties", 2000 IEEE Ultrasonics Symposium, Reference No. 0-7803-6868-6/00, pp 1-4.

*Primary Examiner*—Bret Chen
(74) *Attorney, Agent, or Firm*—Thorpe North & Western, LLP

(57) ABSTRACT

A method for forming diamond tools using CVD techniques. In one aspect, a mold is provided which has an interface surface configured to inversely match a configuration intended for the working surface of a diamond layer in a tool. An adynamic diamond mass or layer is then deposited upon the diamond interface surface of the mold, and a support layer is joined to the growth surface of the adynamic diamond layer. At least a portion of the mold is then removed to expose the working surface of the diamond which has received a shape which inversely corresponds to the configuration of the mold's diamond interface surface.

58 Claims, 12 Drawing Sheets

U.S. PATENT DOCUMENTS

| | | |
|---|---|---|
| 5,576,589 A | 11/1996 | Dreifus et al. |
| 5,843,224 A | 12/1998 | Zachai et al. |
| 5,920,143 A | 7/1999 | Tarui et al. |
| 6,022,622 A * | 2/2000 | Domoto et al. .............. 428/408 |
| 6,054,719 A | 4/2000 | Fusser et al. |
| 6,222,299 B1 | 4/2001 | Graebner et al. |
| 6,248,394 B1 | 6/2001 | Du et al. |
| 6,448,688 B1 | 9/2002 | Fujii et al. |
| 6,466,105 B1 | 10/2002 | Lobl et al. |
| 6,592,436 B1 * | 7/2003 | Abe et al. ..................... 451/64 |
| 6,659,161 B1 * | 12/2003 | Sung ............................ 164/74 |
| 6,710,513 B1 | 3/2004 | Nakahata et al. |
| 6,814,130 B1 * | 11/2004 | Sung ............................ 164/74 |

FOREIGN PATENT DOCUMENTS

| | | |
|---|---|---|
| GB | 2 292 253 | 2/1996 |
| WO | WO 93/01617 | 1/1993 |
| WO | WO 94/08077 | 4/1994 |

\* cited by examiner

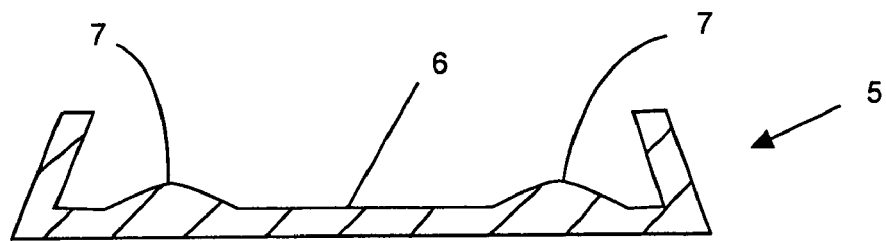
Figure 3a
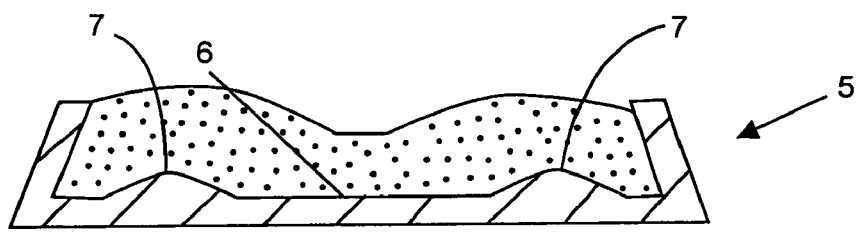
Figure 3b
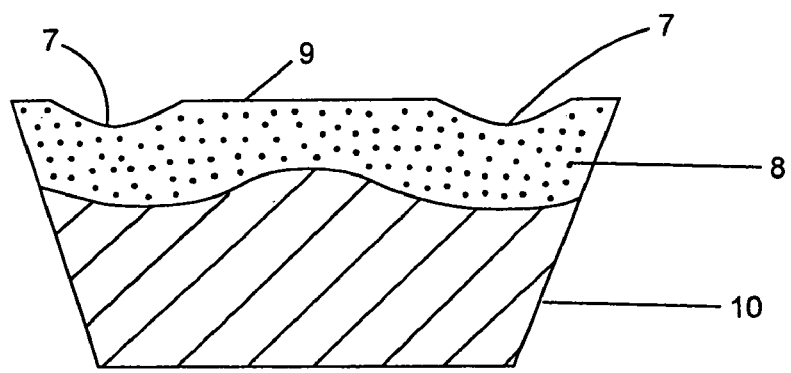
Figure 3c
Fig 3

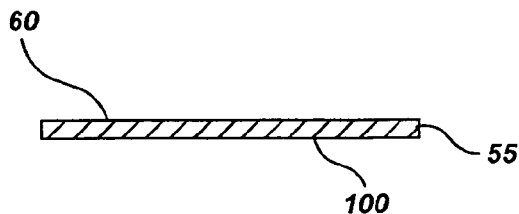
Fig. 7a
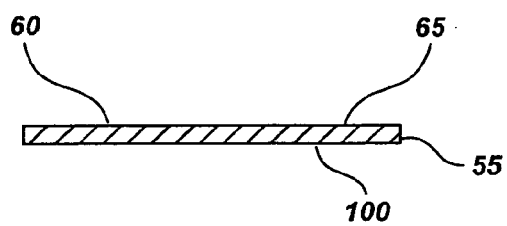
Fig. 7b
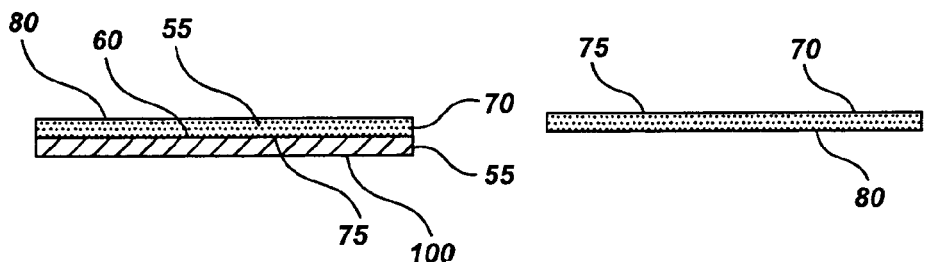
Fig. 7c          Fig. 7e
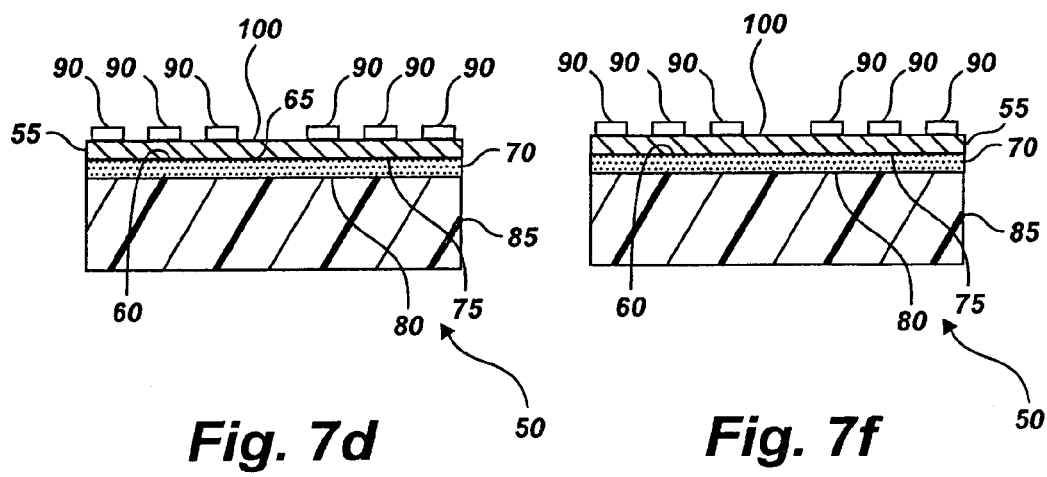
Fig. 7d          Fig. 7f

CASTING METHOD FOR PRODUCING SURFACE ACOUSTIC WAVE DEVICES

PRIORITY DATA

This application is a continuation-in-part of U.S. patent application Ser. No. 10/002,395, filed on Oct. 19, 2001, now U.S. Pat. No. 6,814,130 which is a continuation-in-part of U.S. patent application Ser. No. 09/687,444, filed on Oct. 13, 2000, now U.S. Pat. No. 6,659,161 both of which are incorporated herein by reference in their entireties.

FIELD OF THE INVENTION

The present invention relates to devices incorporating super-hard materials, such as diamond or diamond-like substances, and methods for making such devices. More particularly, the present invention relates to the use of chemical vapor deposition for making devices incorporating very thin layers of super-hard materials.

BACKGROUND OF THE INVENTION

Diamond and diamond-like substances have many properties, such as wear resistance, thermal conductivity, acoustic transmission, and corrosion inertness, which make them desirable for a variety of industrial applications. To this end, diamond and diamond-like substances have been incorporated into tools for various purposes such as saw blades, drill bits, and electronic components such as surface acoustic wave filters. One method for incorporating diamond or diamond-like materials into a tool is known as chemical vapor deposition (CVD).

Various CVD techniques have been used in connection with depositing diamond or diamond-like materials onto a substrate. Typical CVD techniques use gas reactants to deposit the diamond or diamond-like material in a layer, or film. These gases generally include a small amount (i.e. less than about 5%) of a carbonaceous material, such as methane, diluted in hydrogen. A variety of specific CVD processes, including equipment and conditions, are well known to those skilled in the art.

In forming a layer of diamond, or diamond-like material on a substrate using CVD techniques, a plurality of diamond grains, or "seeds," may be first placed upon the substrate surface. The placement of such seeds may be accomplished using CVD itself such as by applying a voltage bias, by polishing with micron-sized diamond, or by other methods known in the art. These seeds act as diamond nuclei and facilitate the growth of a diamond layer outwardly from the substrate as carbon vapor is deposited thereon. As a result, the growing side of the diamond layer becomes increasingly coarse in grain size, and must ultimately be ground and polished to a smooth finish such as by a mechanical means, in order to be suitable for many industrial applications. However, as diamond and diamond-like substances are among the hardest known materials, such mechanical grinding and polishing is difficult and tedious. Moreover, the cost of polishing often exceeds the cost for making the diamond film itself. In addition, mechanical polishing inevitably introduces micro-cracks or variations on the diamond surface. Such cracks and variations are detrimental to certain applications.

For example, if the diamond is used make a surface acoustic wave (SAW) filter, micro-cracks or variations in the diamond surface will introduce noise into the signal and therefore deteriorate the quality of the filtered wave. Diamond has a surface acoustic wave velocity of about 11 km/sec which is significantly higher than most materials commonly used in SAW filters such as quartz, lithium titanate, lithium niobate, langaside, zinc oxide, aluminum nitride and others. Typical methods for producing diamond-containing SAW filters involve polishing the diamond to create an even surface. However, these methods introduce surface defects which adversely effect performance. Typical surface roughness for these types of methods may approach about 3 nanometers (nm). As a result, as wavelengths decrease, the quality of the filtered wave decreases dramatically. For example, a wave produced using an interdigital transducer (IDT) spacing of about 1 micron traveling across a surface having a roughness of 3 nm results in a surface roughness which represents about 0.3% of the wavelength. As commercial pressures drive applications to use higher frequencies in order to accommodate greater amounts of information, the surface roughness will be a significant limiting factor.

As such, a process for making diamond containing devices which require little or no post synthesis work to achieve a finished product, and which contain a surface having an extreme smoothness, continues to be sought through on-going research and development efforts.

SUMMARY OF THE INVENTION

Accordingly, the present invention provides diamond tools, and methods for making diamond tools that do not require post fabrication polishing or finishing of the working surface. As such, the present devices and methods are capable of providing a super-hard working surface which has few or no micro-cracks or undesired variations and which is particularly suitable for use in SAW filters and the like.

As a general matter, the method of making an acoustic wave (SAW) device in accordance with the present invention begins by providing a mold having an interface surface configured to inversely match a configuration intended for a working surface of the diamond SAW device. An adynamic diamond layer is then grown on the diamond interface surface of the mold using a CVD technique. As it growth proceeds, the adynamic diamond layer receives a growth surface opposite the working surface, which is then joined to a support layer. Subsequent to the joining of the support layer, at least a portion of the mold may be removed.

In the SAW filters of the present invention, a piezoelectric layer is coupled to the working surface of the diamond. This may be accomplished in a variety of manners. For example, in one detailed aspect of the present invention, the mold may be a piezoelectric material. In another aspect, a thin piezoelectric layer may be formed on the working surface subsequent to the step of removing the mold. In yet another aspect, the thin piezoelectric layer can be formed on the working surface by bonding a piezoelectric material to the working surface using either an organic binder layer or reactive bonding layer. In a further aspect, the thin piezoelectric layer can be formed by deposition using a PVD or CVD method. In still another aspect, the thin piezoelectric layer can be formed on the interface surface of the mold prior to growing the diamond layer thereon. In such an embodiment, the diamond layer is grown on the piezoelectric material. If necessary, the piezoelectric layer can be thinned depending on the desired application.

The present invention additionally provides for the simultaneous fabrication of a plurality of SAW filters. Such a method includes the formation of a number of grooves in a mold made of a piezoelectric material. The grooves define multiple areas which correspond to individual SAW devices, and can have a depth which corresponds to a desired piezoelectric layer thickness in the final product. Upon formation of the adynamic diamond layer and support material as recited above, the individual SAW devices may be separated from one another along the grooves.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

FIG. 3a is cross section view of a metal mold for fabricating a diamond cutting element, or insert, in accordance with one aspect of the present invention.

FIG. 3b is a cross section view of a diamond mass formed in an ephemeral mold for fabricating a diamond cutting element, or insert, in accordance with one aspect of the present invention.

FIG. 3c is a cross section of a diamond cutting element, or insert formed in accordance with one aspect of the present invention.

FIG. 6a is a side view of a wire coil or pipe mold for fabricating a diamond pipe in accordance with one aspect of the present invention.

FIG. 6b is a side view of a diamond film deposited on the outside of the wire coil mold of FIG. 6a.

FIG. 6c perspective view of the shows the diamond film of FIG. 6b after dissolving the center metal coil in accordance with one aspect of the present invention.

FIG. 6d is a perspective view of the diamond pipe of FIG. 6c with the fitted inside a holder mass in accordance with one aspect of the present invention.

FIG. 7a is a side view of a ceramic mold for fabricating a SAW filter in accordance with one aspect of the present invention.

FIG. 7b is a side view of the ceramic mold of FIG. 7a having a thin nucleation enhancer layer formed upon an interface surface thereof.

FIG. 7c is a side view of a diamond layer grown on the thin nucleation layer and ceramic mold of FIG. 7b.

FIG. 7d is a side view of a SAW having a diamond layer grown on a thin nucleation layer and ceramic mold, as in FIG. 7c, wherein the ceramic mold is a piezoelectric material which is left in place to serve as a piezoelectric layer, which further has a plurality of interdigital transducers formed thereon, in accordance with one aspect of the present invention.

FIG. 7e is a side view of a diamond layer as formed in FIG. 7c, which has had the ceramic mold and thin nucleation enhancer layer removed therefrom to expose the working surface thereof in accordance with one aspect of the present invention.

FIG. 7f is a side view of a SAW formed using the diamond layer of 7c, which has a piezoelectric layer and plurality of interdigital transducers formed on a working surface thereof after the removal of the ceramic mold and thin nucleation enhancer layer in accordance with one aspect of the present invention.

Figure 1:
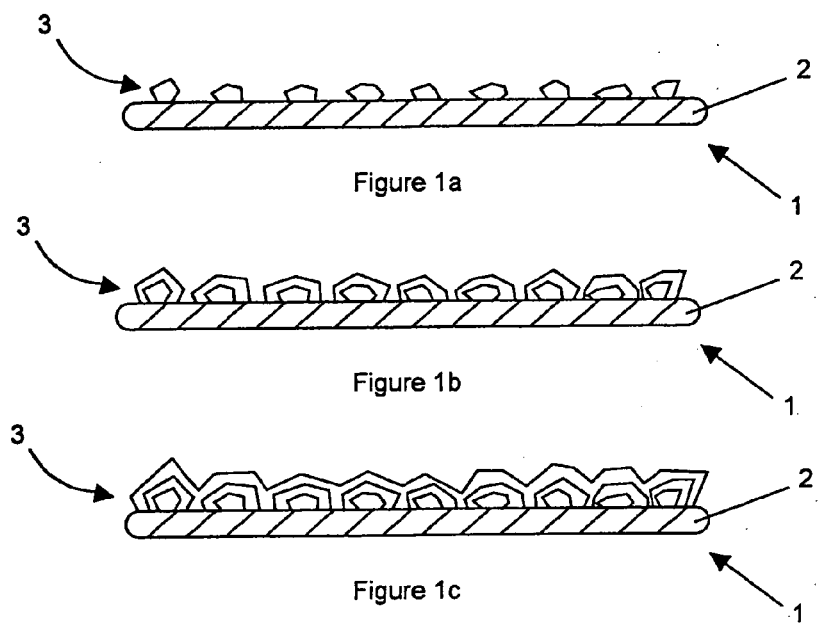
FIG. 1a is a cross section view of a diamond tool being prepared by a conventional CVD technique, having diamond nuclei deposited upon the substrate surface, as is known in the prior art.
FIG. 1b is a cross section view of a diamond tool being prepared by a conventional CVD technique, to allow the growth diamond nuclei upon the substrate surface, as is known in the prior art.
FIG. 1c is a cross section view of a diamond tool being prepared by a conventional CVD technique, to show the growing nuclei of diamond joined together on the substrate surface, to form a continuous film as is known in the prior art.

The above figures are provided for illustrative purposes only. It should be noted that actual dimensions of layers and features will differ from those shown; however for purposes of clarity the dimensions are adjusted.

DETAILED DESCRIPTION

Before the present invention is disclosed and described, it is to be understood that this invention is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

It must be noted that, as used in this specification and the appended claims, the singular forms "a," and, "the" include plural referents unless the context clearly dictates otherwise. Thus, for example, reference to a diamond layer containing "a diamond particle" includes one or more of such particles, reference to "a carbon source" includes reference to one or more of such carbon sources, and reference to "a CVD technique" includes reference to one or more of such CVD techniques.

Definitions

In describing and claiming the present invention, the following terminology will be used in accordance with the definitions set forth below.

As used herein, "tool" refers to any object or device which may be used in creating a work product, or acting on a work piece, to accomplish a desired result. Examples of tools include, but are not limited to: saw blades, drill bits, CMP pad dressers, wire drawing dies, cutting elements or inserts, and pipes, hoses, SAW devices, and coils.

As used herein, "super hard" and "superabrasive" may be used interchangeably, and refer to any crystalline, or polycrystalline material, or mixture of such materials which has a Moh's hardness of about 8 or greater. In some aspects, the Moh's hardness may be about 9.5 or greater. Such materials include but are not limited to diamond, polycrystalline diamond (PCD), cubic boron nitride, polycrystalline cubic boron nitride (PCBN) as well as other super hard materials known to those skilled in the art. Super hard materials may be incorporated into the present invention in a variety of forms including particles, grits, films, layers, etc.

As used herein, "substrate" refers to a non-diamond surface, to which super abrasive particles may be joined in forming a tool. The substrate may be any shape, thickness, or material, required in order to achieve a specific result, and includes but is not limited to metals, alloys, ceramics, and mixtures thereof. Further, in some aspects, the substrate, may be a tool body in and of itself, or may be a material which is capable of being joined to a tool body.

As used herein, "support layer" refers to a non-diamond layer of material that can be bonded to a diamond layer, and once bonded, has sufficient integrity to prevent an adynamic diamond layer from changing shape once separated from the mold upon which it was made. In some aspects, a substrate or tool body may serve as a support layer.

As used herein, "tool body" refers to a device which makes up a substantial part of a tool, to which a superabrasive component may be joined, either directly, or by an intermediate material, or layer.

As used herein, "metallic" refers to any type of material or compound wherein the majority portion of the material is a metal. As such, various oxide, nitride, and carbide compounds, as well as any other material or compound, containing a greater non-metal portion than metal portion are not considered to be "non-metallic." Examples of various metals considered to be particularly useful in the practice of the present invention include, without limitation: aluminum, tungsten, molybdenum, tantalum, zirconium, vanadium, chromium, copper, and alloys thereof.

As used herein, "ceramic" refers to a non-diamond, non-metallic, material, which is hard, heat resistant, corrosion resistant, and can be polished to have a surface roughness (Ra) of less than about 1 micrometer. Further, as used herein, "ceramic" materials may contain at least one element selected from the group consisting of: Al, Si, Li, Zn, and Ga. Oxides, nitrides, and various other compounds which include the above recited elements are well known as ceramics to those skilled in the art. Additional materials considered to be "ceramics" as used herein, such as glass, are known to those skilled in the art. Examples of specific ceramics useful in the present invention include without limitation, Si, $SiO_2$, $Si_3N_4$, $Al_2O_3$, AlN, BN, TiN, ZrN, GaAs, GaP, $LiTaO_3$, $LiNbO_3$, ZnO, glass, such as soda glass, etc. As used herein, "interface surface" refers to the surface of a mold, or ephemeral mold, or other layer of material conveying the shape of the mold, upon which materials used in the fabrication of a diamond layer or film are deposited. Such materials include diamond or other superabrasive particles, as well as peripheral materials used to facilitate diamond layer growth using a CVD technique, such as diamond nucleation enhancers. The interface surface can be the immediate surface of the mold or may include an exposed surface resulting from a thin layer of material formed thereon which does not significantly affect the surface contours and roughness of the original mold surface, and thus conveys the configuration thereof. Such thin layers can include nucleation enhancing materials, piezoelectric materials, and any other material which can be formed in sufficiently thin layers so as to retain a substantially identical surface as the original smooth mold surface.

As used herein with respect to a mold, "outside surface" refers to a surface of the mold which is not in direct contact with the diamond layer, and upon which interdigital transducers may be formed.

As used herein, "adynamic" refers to a type of layer which is unable to independently retain its shape and/or strength. For example, in the absence of a mold or support layer, an adynamic diamond layer will tend to curl or otherwise deform when the mold or support surface is removed. While a number of reasons may contribute to the adynamic properties of a layer, in one aspect, the reason may be the extreme thinness of the layer.

As used herein, "nucleation enhancer" refers to a material, which increases the quality of a diamond layer formed from a plurality of diamond nuclei using a CVD process. In one aspect, the nucleation enhancer may increase the quality of the diamond layer by reducing movement or, or immobilizing diamond nuclei. Examples of nucleation enhancers include without limitation, metals, and various metallic compounds, as well as carbides and carbide forming materials.

As used herein with respect to a nucleation enhancer layer and a piezoelectric layer, "thin" refers to the thickness or depth of the layer being sufficiently small so as to not substantially interfere with the transfer of the intended configuration from the interface surface configuration to the working surface. In one aspect, the thickness of the nucleation enhancer may be less than about 0.1 micrometers. In another aspect, the thickness may be less than 10 nanometers. In another aspect, the thickness may be less than about 5 nanometers.

As used herein, "working surface" refers to the surface of a tool, which contacts a workpiece, or performs a friction-involved function during a work process. Alternatively, the working surface of a tool may be a surface which receives an input signal or transmits or output signal, such as an electrical impulse, or other physical, acoustic, or mechanical wave, such as a surface acoustic wave. In one aspect, the working surface of a tool may be a diamond or other superabrasive material layer.

As used herein, "diamond layer," "diamond particle," and "diamond mass" may be used interchangeably, and refer to any structure, regardless of shape, which contains diamond in any form or amount, which can be incorporated into a tool. Thus, for example, a diamond film partially or entirely covering a surface is included within the meaning of these terms. Additionally, a layer of a material, such as metals, acrylics, or composites, having diamond particles disbursed therein is included in these terms.

As used herein, "non-diamond layer" and "non-diamond mass" may be used interchangeably, and refer to any structure regardless of shape, which does not contain any diamond, but which can be joined to a diamond layer in order to form a diamond tool.

As used herein, "chemical vapor deposition," or "CVD" refers to any method of chemically depositing diamond or other particles in a vapor form upon a surface. Various CVD techniques are well known in the art.

As used herein, "CVD passive material" refers to a material which does not allow deposition of diamond or other materials using CVD methods directly to the material. One example of a CVD passive material with respect to deposition of diamond is copper. As such, during CVD processes carbon will not deposit on the copper but only on CVD active materials such as silicon, diamond, or other known materials. Thus, CVD passive materials can be "passive" with respect to some materials and not others. For example, a number of carbide formers can be successfully deposited onto copper.

As used herein, "drawing channel" refers to the inner channel, or passage of a wire drawing die, through which wire is drawn.

As used herein, "inversely correspond" refers to the inverse relationship between the configuration of a diamond or superabrasive layer's working surface, and the configuration of a mold's interface surface from which the working surface was made, when such surfaces are oriented in the same direction. In other words, when a working surface of a tool is formed at the interface surface of a mold, the configuration of each will inversely correspond to the other when the surfaces are separated and faced in the same direction. In some instances, the inverse correspondence may result in a mirror image.

As used herein, "nucleation side," "nucleation surface," and similar terms may be used interchangeably, and refer to the side or surface of a diamond or superabrasive layer at which nucleation of diamond particles originated. Otherwise described, the nucleation surface of a diamond or superabrasive layer is the side or surface, which was first deposited upon the interface surface of a mold. In many instances, the nucleation surface may become the working surface of the tool.

As used herein, "growth side," "grown side," and "grown surface" may be used interchangeably and refer to the surface of a superabrasive film or layer which is grows during a CVD process.

As used herein, "Ra" refers to a measure of the roughness of a surface as determined by the difference in height between a peak and a neighboring valley. Further, "Rmax" is a measure of surface roughness as determined by the difference in height between the highest peak on the surface and the lowest valley on the surface.

As used herein, "interdigital transducers" (IDT) and "electrodes" may be used interchangeably and refer to conductive or semi-conductive contacts which are coupled to a piezoelectric layer as known by those skilled in the art in order to create a SAW filter or other electronic device. In one aspect of the present invention, the IDT may be coupled to the piezoelectric layer on an outside surface thereof, or on the interface surface thereof.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

As an illustration, a numerical range of "about 1 micrometer to about 5 micrometers" should be interpreted to include not only the explicitly recited values of about 1 micrometer to about 5 micrometers, but also include individual values and sub-ranges within the indicated range. Thus, included in this numerical range are individual values such as 2, 3, and 4 and sub-ranges such as from 1–3, from 2–4, and from 3–5, etc.

This same principle applies to ranges reciting only one numerical value. For example, a range recited as "less than about 5 micrometers" should be interpreted to include all values and sub-ranges between 5 micrometers and 0 micrometers, including the value of 0 micrometers. Furthermore, such an interpretation should apply regardless of the breadth of the range or the characteristics being described.

The Invention

It is well known in the art to make diamond tools for various applications using chemical vapor deposition (CVD) techniques. Referring to FIGS. 1a–1c, is shown generally the beginning stages of diamond growth on a tool substrate 2, to form a diamond tool 1, produced by various known CVD processes. Such processes generally entail growing a diamond film 3, with increasing thickness on the outward surface of the tool substrate.

Figure 2:
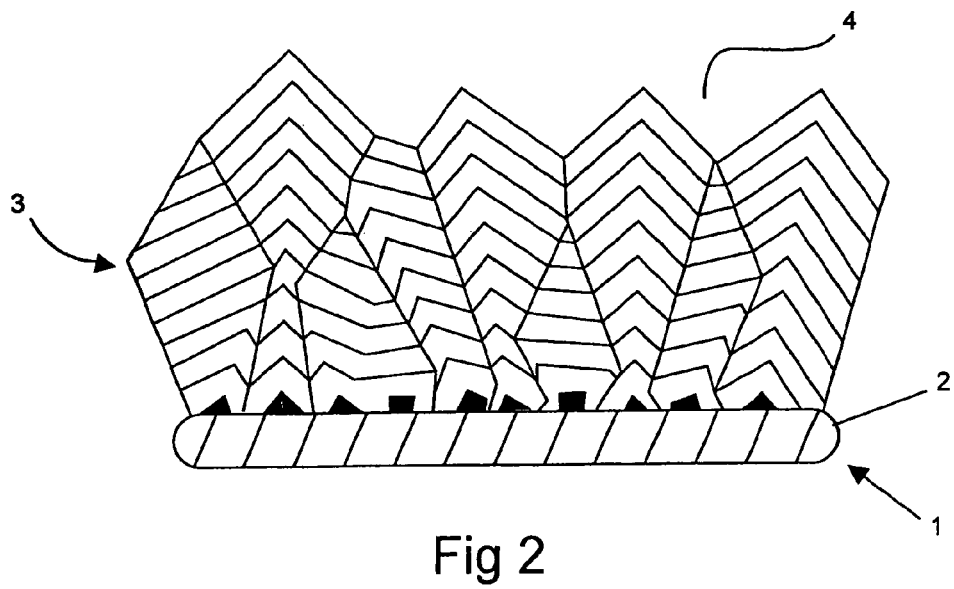
FIG. 2 is a cross section of diamond tool having a diamond film showing the diamond growth and resultant diamond surface deposited upon a substrate using any conventional CVD technique, as is known in the prior art.

FIG. 2 shows the results of completed diamond film growth using conventional CVD techniques. As the layer of diamond 3 continues to grow, the working surface 4 thereof becomes increasingly rough. Unfortunately, a rough working surface may be unsuitable for many tool applications, such as SAW filters. Therefore, machining of the working surface 4 into a desired configuration is required.

The present invention employs a process of making diamond tools which removes the necessity of post formation machining or finishing, of the working surface 4, and thus dispenses with the significant time and expense associated therewith. Such a process is capable of creating a tool having a diamond or other superabrasive layer working surface that has a shape inversely corresponding to the configuration of an interface surface in a mold, upon which the diamond or other superabrasive layer is deposited. Further, a non-diamond substrate may be joined to the grown side of the diamond or other superabrasive film to form a tool body. As such, the finished working surface is capable of receiving any configuration which may be imparted by a mold without post formation machining.

The diamond or other superabrasive layer working surface may be formed by depositing applicable nuclei, such as diamond nuclei, on the interface surface of a mold and then growing the nuclei into a film or layer using CVD. Such a tool includes, or in some aspects consists of, a diamond or other superabrasive particle layer working surface having a shape inversely corresponding to the configuration of an interface surface in a mold. In some aspects, such a working surface may be the mirror image of the interface surface. Further, a non-diamond layer may be joined to the grown surface afterward to form a tool body.

In one aspect, the process of the present invention includes providing a mold having a diamond interface surface configuration which inversely corresponds to a desired shape for a working surface of the tool, coating the diamond interface surface with diamond using a chemical vapor deposition (CVD) technique to form a diamond layer, and separating the mold from the diamond layer. In another aspect, the process of the present invention consists of providing a mold having an interface surface configuration which inversely corresponds to a desired shape for a working surface of the tool, coating the diamond interface surface with diamond using a CVD technique to form a diamond layer, and separating the mold from the diamond layer. Various CVD techniques are known in the art, and can be employed with the process of the present invention. The result of such a process is that the working surface of the diamond layer receives a configuration which inversely corresponds to the configuration of the diamond interface surface of the mold.

In certain aspects of the present invention, when a ceramic mold is used as will be more fully described below, the process of the present invention may comprise or consist of providing a ceramic mold, having an interface surface configured to inversely match a configuration intended for a working surface of a diamond tool, forming a thin nucleation enhancer layer on the interface surface, and growing a diamond layer on the nucleation enhancer layer using a CVD technique, such that the working surface directly contacts the nucleation enhancer layer and receives the intended configuration from the interface surface of the mold. Subsequently, the diamond layer may be separated from the ceramic mold and the nucleation enhancer layer in order to expose the working surface.

The mold used in the process of the present invention may be of any material sufficient to withstand the conditions of the CVD techniques, and allow the formation of a diamond film, or layer thereon. However, in one aspect, the mold may be made of, or substantially made of, a metallic material. The metallic material may be a member selected from the group consisting of: aluminum, copper, tungsten, molybdenum, tantalum, zirconium, vanadium, and chromium. In another embodiment, the mold may be made of, or made substantially of, non-metals, such as carbides and ceramics, including glass, oxide, and nitride materials. Examples of carbide materials include without limitation, tungsten carbide (WC), silicon carbide (SiC), titanium carbide (TiC), zirconium carbide (ZrC), and mixtures thereof among others. Examples of oxide materials include without limitation, quartz (i.e. crystalline $SiO_2$), corundum or sapphire (i.e. $Al_2O_3$), $LiTaO_3$, $LiNbO_3$, ZnO, and mixtures thereof. Examples of nitride materials include without limitation, silicon nitride ($Si_3N_4$), aluminum nitride (AlN), boron nitride (BN), titanium nitride (TiN), zirconium nitride (ZrN), and mixtures thereof, among others. Examples of glass include all types of glass including soda glass, etc.

In certain aspects of the present invention, for example, in the production of SAW filters, the mold may be made of a piezoelectric material. A wide variety of piezoelectric materials are suitable for use as a mold in the present invention, including many of the ceramic materials listed above. However, in one aspect, the piezoelectric materials used may be a member selected from the group consisting of: $SiO_2$, $Si_3N_4$, $Al_2O_3$, AlN, GaAs, GaP, $LiTaO_3$, $LiNbO_3$, ZnO, $Pb(Zr, Ti)O_3$, $Ta_2O_5$ $Nb_2O_5$, BeO, $Li_2B_4O_7$, $KnbO_3$, ZnS, ZnSe, CdS, PZT, $Bi_4Ge_3O_{13}$, $La_3Ga_5SiO_{14}$, $YVO_4$, and mixtures thereof. In one aspect, the piezoelectric material may be AlN. Further, various carbides having a non-isometric crystalline structure are piezoelectric, such as hexagonally shaped tungsten carbide crystals. A variety of piezoelectric carbides are known to those skilled in the art and may be used herein. In another aspect of the invention, the piezoelectric material may be obtained from a single crystal ingot in order to control the crystal orientation of the piezoelectric material and provide a high electromechanical coupling factor.

Certain non-metallic materials, such as the carbide and ceramic materials recited above are particularly well suited for use as a mold in the present invention because of their hardness and ability to achieve an extremely smooth interface surface. A smooth interface surface is particularly important when making a tool that requires a smooth working surface. In many cases, the interface surface of a ceramic material may be polished to have a roughness (Ra) of less than about 10 micrometers. In other instances, the surface roughness (Ra) may be less than about 5 micrometers. In yet other instances, the surface roughness (Ra) may be less than about 1 micrometer. Various methods for polishing the interface surface to achieve such a degree of smoothness, for example with diamond powder or paste, or other diamond tools are well known to those skilled in the art.

While ceramics and other non-metal materials are able to achieve a smooth interface surface, many of these materials, such as oxides, are unable to nucleate diamond and retain it in place very well. Therefore, in order to overcome such a deficiency, in one aspect of the present invention, a thin nucleation enhancer layer may be coated upon the interface surface of the mold. Diamond nuclei are then placed upon the intermediate layer, and the growth of the diamond layer proceeds via CVD as described herein.

A variety of suitable materials will be recognized by those in skilled in the art which can serve as a nucleation enhancer. In one aspect of the present invention, the nucleation enhancer may be a material selected from the group consisting of metals, metal alloys, metal compounds, carbides, carbide formers, and mixtures thereof. Examples of carbide forming materials include without limitation, tungsten (W), tantalum (Ta), titanium (Ti), zirconium (Zr), chromium (Cr), molybdenum (Mo), silicon (Si), and manganese (Mn). Additionally, examples of carbides include tungsten carbide (WC), silicon carbide (SiC), titanium carbide (TiC), zirconium carbide (ZrC), and mixtures thereof among others.

The nucleation enhancer layer, when used, is a layer which is thin enough that it does not to adversely affect the transfer of the intended configuration from the interface surface to the working surface. In one aspect, the thickness of the nucleation enhancer layer may be less than about 0.1 micrometers. In another aspect, the thickness may be less than about 10 nanometers. In yet another aspect, the thickness of the nucleation enhancer layer is less than about 5 nanometers. In a further aspect of the invention, the thickness of the nucleation enhancer layer is less than about 3 nanometers.

The thickness of the diamond or other superabrasive material layer may be any thickness desired. In one aspect multiple layers of diamond may be deposited over one another using CVD techniques while in the mold, or after the initial layer has been formed and removed from the mold to form a consolidated layer of desired thickness. In one aspect, the diamond layer may be thickened after the deposition of the initial film, using non-CVD techniques, as are known in the art of diamond fabrication and consolidation. In another aspect of the invention, such thickening may take place while the initial diamond layer is still in the mold, or after it has been removed (e.g. by dissolution in acid or KOH). In yet another aspect of the invention, the diamond layer fabricated may have a thickness of from about 30 micrometers to about 200 micrometers. In an additional aspect of the invention, the diamond layer may have a thickness of less than about 100 micrometers. In a further aspect of the invention, the diamond layer may have a thickness of about 200 micrometers.

Any CVD process may be used to create the diamond or other superabrasive layer for the tool of the present invention. Many methods are known in the art, and may be selected by the skilled artesian to achieve a particularly desired result. In one aspect of the invention, the CVD technique employed in the process of the present invention is a member selected from the group consisting of: hot filament, microwave plasma, oxyacetylene flame, and direct current arc techniques. Further, the reactant gases used during such techniques may be any which are known in the art as useful for safely accomplishing diamond layer fabrication using a selected CVD technique. However, in one aspect, the gases used in the CVD technique are a combination of methane and hydrogen gases.

After the diamond or other superabrasive layer has been deposited on the interface surface of the mold, or the nucleation enhancer layer, the mold, as well as the nucleation enhancer layer if used, may be separated from the diamond using any mechanism suitable for removing the particular substance from which the mold and nucleation enhancer layer is fabricated. In one aspect of the present invention, the mold is chemically removed from the diamond or other superabrasive layer, such as by dissolution thereof with acid or a based solution such as KOH or by plasma etching. In another aspect, the mold is physically removed from the diamond or other superabrasive layer, for example by grit blasting or mechanical polishing. In yet another aspect, the mold is removed from the diamond or other superabrasive layer using a heat or cold treatment, such as a furnace for melting the mold, or liquid nitrogen for freezing and crumbling the mold. In a further aspect, separation of the mold from the diamond or superabrasive film due to heating or cooling may be a result of different thermal expansion properties between the mold material and the diamond material.

For certain applications, such as in SAW filters, the mold, or a portion of the mold, and nucleation enhancer layer, if used, may be left in contact with the diamond or other superabrasive material layer. In such instances, the portion of the mold which remains becomes an integral part of the finished tool. In order to produce a finished product under these circumstances, in some aspects, the outside surface of the mold may be polished or shaped to provide a desired configuration or thickness therefor, if such work has not been accomplished prior to the fabrication of the diamond layer. In one aspect, the thickness of the original mold may be any thickness or configuration required to produce a specific tool. In another aspect, the thickness may be greater than about 1 millimeter. In yet another aspect, the thickness may be greater than about 5 millimeters. In an additional aspect, the outside surface of the mold may be polished or shaped to have a configuration required to produce a specific tool. In a further aspect, the mold may be polished or shaped into a layer have a thickness of less than about 1 micrometer. In another aspect, the thickness may be less than about 0.1 micrometer. Further, when making a SAW filter, a plurality of interdigital transducers may be coupled to either the outside or interface surface of the mold. Either before or after the mold, and nucleation enhancer layer if used, or a portion thereof, is removed from the diamond or other superabrasive layer, the layer may be joined to a non-diamond tool body, or intermediate substrate for incorporation into a tool body. Materials for such tool bodies and substrates include any materials suitable for, or required by, a particular tool shape, use, or function. Examples without limitation include resins, metals, silicon, ceramics and composites thereof.

In addition to the attachment of a tool body, additional components may be formed upon the exposed working surface of the diamond layer after removal of the mold, and nucleation enhancer layer if used. In one aspect, a piezoelectric layer as recited above may be formed upon the working surface of the diamond layer in order to form a SAW filter. The types of tools which can be fabricated using the process of the present invention are any tool for which an advantage may be found for incorporating diamond or other superabrasive material therein. In many cases, the present invention enables tools to be constructed with a configuration which was difficult, if not impossible using methods known in the prior art. Examples without limitation include tools requiring a hole or channel having a non-rounded or non-circular shape such as a square shape, which cannot be fabricated using a drill bit, or other tools which require intricate working surface ornamentation such as coils in a pipe, or other delicate structures, etc. By way of specific example without limitation, coiled pipes, drawing dyes, such as wire drawing dyes, and extruding dyes may be made. Other shapes such as convex, concave, and diaphragm shapes, or configurations, as well as working surface micro-characteristics, such as rough and smooth surfaces may be easily produced using the method of the present invention. By way of example without limitation, speaker diaphragms, such as tweeter diaphragms may be produced. In yet another example, SAW filters may be produced using the method of the present invention. The SAW filters of the present invention can be incorporated into various telecommunications devices such as telecommunications devices, mobile phones, and other handheld devices. Other potential applications of the present invention include incorporation into weight measurement devices and sensors for measuring absorbed gas. Those skilled in the art will recognize the potential advantages of SAW filters of the present invention and the methods by which such devices can be incorporated into various devices such as those mentioned above. One significant advantage in these types of applications which require a very smooth working surface, is that because little or no working surface machining is necessary after removing the mold, the number of variations, microcracks or fissures which are caused by such machining is substantially reduced, or eliminated. The reduced incidence of variations, including microcracks on the working surface greatly enhances the quality of the input signal received, or the output signal produced.

As the nucleation surface of the diamond layer is to be the working surface of the tool, care should be taken to ensure that this surface is of the highest quality and integrity possible. Different degrees of quality may be achieved during the CVD process, as required by the particular application of the tool being fabricated. Those of ordinary skill in the art will readily recognized the differing conditions and techniques which produce a given degree of quality, and will be able to achieve various degrees of quality without undue experimentation.

Various methods may be employed to increase the quality of the diamond in the nucleation surface of the diamond layer which is created by CVD techniques. For example, diamond particle quality may be increased by reducing the methane flow rate, and increasing the total gas pressure during the early phase of diamond deposition. Such measures, decrease the decomposition rate of carbon, and increase the concentration of hydrogen atoms. Thus a significantly higher percentage of the carbon will be deposited in a $sp^3$ bonding configuration, and the quality of the diamond nuclei formed is increased. Additionally, the nucleation rate of diamond particles deposited on the diamond interface surface of the mold or the nucleation enhancer layer may be increased in order to reduce the amount of interstitial space between diamond particles. Examples of ways to increase nucleation rates include, but are not limited to: applying a negative bias in an appropriate amount, often about 100 volts, to the diamond interface surface of the mold; polishing the diamond interface surface of the mold with a fine diamond paste or powder, which may partially remain on the interface surface; and controlling the composition of the diamond interface surface such as by ion implantation of C, Si, Cr, Mn, Ti, V, Zr, W, Mo, Ta, and the like by PVD or PECVD. Physical vapor deposition (PVD) processes are typically at lower temperatures than CVD processes and in some cases can be below about 200° C. such as about 150° C. Other methods of increasing diamond nucleation will be readily apparent to those skilled in the art.

In one aspect of the present invention, the interface surface of a mold may be polished using a diamond tool or diamond powder in order to achieve a particular surface ornamentation. Polishing with diamond powder or paste is especially useful when an ultra-smooth interface surface is desired. Further, when a fine diamond paste is used to polish the interface surface, many diamond particles may become embedded in the diamond interface surface, and can serve as seeds for increased nucleation rates. Certain metals, such as iron, nickel, cobalt, and their alloys, are known to catalyze diamond into amorphous carbon or graphite at high temperatures (i.e. greater than 700° C.). Thus, by limiting the amount of such substance in the composition of the interface surface of the mold, the amount of diamond which will be catalyzed to graphite is greatly reduced, and the overall quality of the nucleation surface is increased.

In one more detailed aspect of the present invention, the interface surface of the mold can be etched with micro-scratches to enhance nucleation. One method of introducing such micro-scratches is to immerse the mold in an acetone bath containing suspended micron-size diamond particles. Ultrasonic energy can then be applied to the mold and/or the fluid. Upon removal of the mold from the ultrasonic bath, a portion of the micron-sized diamonds remain on the surface as diamond growth seeds.

In another detailed aspect of the present invention, nucleation can be optionally enhanced by applying an electrical current such that a strong negative bias is created at the mold. An applied voltage of about 120 volts can increase nucleation density up to a million fold.

In one aspect, tungsten carbide may be used as the material for the mold, including the diamond interface surface thereof. However, by limiting the amount of cobalt binder contained therein to less than about 4% w/w, the incidence of diamond catalysis is greatly reduced. Further, it has been found that binder free tungsten carbide materials may be used to greatly reduce diamond catalysis. Additionally, it has been found that using ultra fine or sub-micron tungsten carbide grains creates a very smooth diamond interface surface which increases diamond nucleation. Additionally, the smooth micro-configuration of the interface surface is imparted to the working surface of the diamond layer.

Thus a diamond tool of the present invention may comprise a diamond layer having a working surface which is the nucleation surface of the diamond layer, and a non-diamond layer joined to the grown side of the diamond layer. Further, the process of making a diamond tool in accordance with the present invention may include the steps of: molding the working surface of a diamond layer for a tool into a desired configuration using a suitable mold, separating the mold from the diamond layer, and joining the diamond layer to a non-diamond substrate, such that the nucleation surface of the diamond layer becomes the working surface of the tool.

The method of the present invention is particularly suitable for production of SAW devices, such as SAW filters, wherein a smooth working surface is important for providing the desired wave propagation results having a coherent pattern with minimal scattering and improved signal to noise ratios. In addition, diamond has a relatively high thermal conductivity such that SAW devices incorporating diamond may be operated at higher power than many conventional materials. High thermal conductivity also results in greater durability and service life. Furthermore, due to the high SAW velocity of diamond a greater amount of information may be transmitted using such diamond SAW devices. Diamond SAW filters of the present invention are expected to operate at frequencies of between about 2 GHz and 100 GHz, and between 3 GHz and 10 GHz and having a high signal clearness. One consideration in using diamond in conjunction with piezoelectric materials as in SAW filters is the strength of the bond between the layers. A poor bond increases insertion loss and decreases the coupling coefficient. SAW devices of the present invention may have coupling coefficients of up to about 6%. Although the above described methods are generally applicable to SAW devices the following description is focused on using the present invention in conjunction with SAW devices. As such, it will be understood that the principles described above are also applicable to the following discussion of SAW devices.

Generally, a mold having an interface surface configured to inversely match a configuration intended for the working surface of the diamond layer of the SAW device is provided. The mold may be made of any suitable material as described in connection with other embodiments herein. Additionally, the mold may be designed to form a single or multiple SAW devices from which individual final SAW devices may be recovered. The mold is polished to a very smooth surface, i.e. less than about 3 nm and preferably less than about 5 angstrom surface roughness. In one embodiment, the surface roughness is about 3 angstroms. Polishing the mold interface surface may be accomplished using a variety of methods as described above, however use of micron or nano-sized diamond particles also provides a good nucleation enhancing layer of particles during the polishing step.

In accordance with one aspect of the present invention, an adynamic diamond layer is grown on the mold using a CVD technique. The working surface is produced at the interface surface of the mold as the diamond layer grows. Once the CVD process is complete, the growth surface remains exposed and is typically rough compared to the nucleation surface. As mentioned above, the adynamic diamond layer is not self-supporting such that if the mold were removed leaving only the diamond layer, the layer would curl or otherwise lose its intended shape, resulting in an unsuitable surface for use in a SAW device. Typically, the thickness of the adynamic diamond layer is less than about 30 micrometers such as between about 5 and about 20 micrometers. Therefore, in order to prevent deformation of the adynamic layer, a support layer may be joined to the growth surface of the adynamic diamond layer prior to removing the mold or a portion thereof in order to prevent curling of the adynamic diamond layer. Although, as frequencies used in SAW devices increases this thickness may be reduced accordingly. The minimal diamond thickness also advantageously decreases production time and costs.

In one embodiment of the present invention, a thin layer of piezoelectric material is placed on the interface surface of the mold prior to growing the diamond layer thereon. Using a piezoelectric material which can also act as a nucleation enhancing layer, such as AlN, avoids the requirement for a separate nucleation enhancing layer, although such could be used.

Alternatively, a piezoelectric material may be attached to the working surface of the diamond layer after the ceramic mold is removed. In some aspects, the piezoelectric material may be sputtered onto the working surface of the diamond layer or otherwise grown. Such methods of depositing piezoelectric material such as ZnO or AlN on a diamond surface are well known to those skilled in the art such as sputtering on a heated substrate.

In an alternative embodiment of the present invention, it may be suitable to use a piezoelectric blank of substantial thickness. Typical piezoelectric blanks are single crystals grown as an ingot which are then cut for use in SAW devices. Single crystal piezoelectric materials suitable for use in the present invention include, but are not limited to, ZnO, quartz, langaside, lead zirconium titanate (PZT), lithium tantalate, lithium niobate, aluminum nitride, and the like. Growth of these materials requires temperatures at which diamond reverts to carbon. However, in accordance with one aspect of the present invention, these piezoelectric blanks may be bonded to the working surface of the diamond layer using an ultra thin layer of bonding material, thus avoiding the need for growth thereof on the diamond layer.

Prior to bonding with the working surface, a surface of the piezoelectric material should be polished to a smooth finish having a surface roughness of less than about 1 nanometer. In one aspect of the present invention, the support layer is joined to the growth surface of the adynamic diamond layer by brazing. A variety of brazing alloys may be suitable for use in the present invention. Of particular benefit are braze alloys which include a carbide former such as Ti, Cr, Si, Zr, Mn, and mixtures thereof. Several exemplary braze alloys include those of Ag—Cu—Ti, Ag—Cu—Sn—Ti, Ni—Cr—B—Si, Ni—Cu—Zr—Ti, Cu—Mn, and mixtures thereof. The brazing alloy may be supplied in any known form such as a powder or as a thin foil. Typical brazing temperatures are below about 1000° C. such as about 900° C.

However, the substrate should have a thermal expansion which is comparable to that of diamond in order to prevent damage to the adynamic diamond layer upon cooling from the brazing temperatures. Support layer materials suitable for use in the present invention include, but are not limited to, tungsten, silicon, $Si_3N_4$, SiC, BN, graphite, other ceramics, glass, and mixtures thereof. Brazing to the growth surface of the diamond layer has the added advantage in that the growth surface is rough, increasing the strength of the braze bond between the diamond layer and the support layer.

In some embodiments of the present invention, it may be desirable to use a non-carbide forming material for the mold. For example, when the mold is a non-carbide forming material such as copper, the diamond layer will separate from the mold upon cooling. Either before or after cooling a braze foil may be placed on the growth surface of the adynamic diamond layer. Subsequently, a support layer is placed against the braze foil and the assembly is pressed together under heat, and optionally vacuum, in order to braze the diamond layer to the support layer. In this embodiment, the mold is not attached to the diamond layer and may be easily removed.

Alternatively, the working surface of the adynamic diamond layer may be placed against a pressing surface which may be optionally coated with a layer of material which prevents bonding of the pressing surface to the diamond layer, such as an aerosol containing boron nitride. The braze foil may then be placed against the growth side of the adynamic diamond layer by carefully flattening the curved diamond layer followed by pressing the support layer against the braze foil and brazing the assembly as described above. Following joining the support layer, a portion of or the entire ceramic mold may be removed without damaging the adynamic diamond layer. The working surface of the diamond may be polished to remove any residual graphitic bonds, but is often not required to achieve the necessary smooth finish. Any such polishing would be minimal and would be on the order of angstroms, occasionally on the order of nanometers, rather than microns.

Typical SAW devices utilize a layer of piezoelectric material. In one aspect of the present invention, a thin layer of piezoelectric material is placed in contact with the smooth working surface of the diamond layer. For example, waves propagated in a SAW filter move atoms in a circular motion. This circular motion typically affects atoms to a depth of about five wavelengths. Thus, for high frequency applications the wavelength may be up to about 1 micron, therefore only up to about 5 microns of diamond thickness is required for achieving the desired filtering using a diamond surface coated with a thin piezoelectric material according to the present invention, although other thicknesses can be used. The piezoelectric material can be any thickness, but is generally from about 0.5 micron to about 5 microns, and in one embodiment is about 1 micron.

In one embodiment of the present invention, a thin layer of piezoelectric material is placed on the interface surface prior to growing the diamond layer thereon. Piezoelectric materials which are particularly suitable for use in the present invention, include, but are not limited to, AlN, lithium niobate, ZnO, and mixtures thereof. Using a piezoelectric material which also acts as a nucleation enhancing layer such as AlN avoids the requirement for a separate nucleation enhancing layer, although such could be used. By depositing a thin layer of piezoelectric material the smooth surface of the mold interface is retained on the deposited piezoelectric layer. In this embodiment, a variety of materials can be used to form the mold although the preferred materials include Si, W, Ti, Cr, Zr, Mo, Mn, and mixtures thereof. The mold, or a portion thereof, can be removed subsequent to the steps of growing the adynamic diamond layer and/or joining the support layer to the growth surface.

Alternatively, a piezoelectric material may be attached to the working surface of the diamond layer after the ceramic mold is removed. Typically, the piezoelectric material may be sputtered onto the working surface of the diamond layer or otherwise grown. Such methods of depositing piezoelectric material such as ZnO or AlN on a diamond surface from a vapor phase are well known to those skilled in the art such as CVD, PVD, or sputtering on a heated substrate.

In an alternative embodiment of the present invention, it may be suitable to use a piezoelectric blank of substantial thickness. Typical piezoelectric blanks are single crystals grown as an ingot which are then cut for use in SAW devices. Single crystal piezoelectric materials suitable for use in the present invention include, but are not limited to, ZnO, quartz, langaside, lead zirconium titanate (PZT), lithium tantalate, lithium niobate, aluminum nitride, and the like. Growth of these materials requires temperatures at which diamond reverts to carbon. Additionally, in one aspect of the present invention, the piezoelectric blanks can be optionally coated with a carbide former.

However, in accordance with one aspect of the present invention, these piezoelectric blanks may be bonded to the working surface of the diamond layer using an ultra thin layer of bonding material. Prior to bonding with the working surface, a surface of the piezoelectric material should be polished to a smooth finish having a surface roughness of less than about one nanometer, preferably less than about 5 angstroms. Subsequently, an ultra thin layer of bonding material may be produced by forming a layer of bonding material on either the working surface or the smooth blank surface and then pressing the two surfaces together in order to reduce the bonding layer thickness to less than about 1 micron and preferably less than about 10 nanometers (i.e. only a few molecules thick). The bonding material may comprise an organic binder such as an epoxy or may be a reactive metal such as Ti, Si, Zr, Cr, Mo, W, Mn, or mixtures thereof. In the case of a reactive metal, the metal may be sputtered on a either the working surface or the smooth blank surface and then pressed against the other surface under heat and vacuum conditions. At these ultra thin thicknesses, the bonding material is more stable at higher temperatures. For example, typical epoxy binders will fail at temperatures above about 200° C., however at ultra thin thicknesses the epoxy remains strong at higher temperatures. Further, SAW devices do not require the same degree of strength as in cutting applications. Therefore, these thin layers of bonding materials are suitable for SAW devices. The bonded piezoelectric blank can then be ground and polished to any desired thickness, e.g. about 1 micrometer in the case of a SAW filter.

For example, a lithium niobate or silicon dioxide blank may be polished to a smooth finish and then Ti, Si, or other reactive metal may then be sputtered thereon using known techniques such as low temperature CVD (RFCVD). Reactive metals may also be sputtered onto the working surface of the diamond so that either or both surfaces include a layer of reactive bonding metal thereon. The reactive metal coated blank is then pressed against the working surface of the diamond and heated in a vacuum furnace. This process causes the formation of carbide bonds to the diamond and nitride or oxide bonds to the piezoelectric material. The temperatures used in the reactive metal bonding process should be below the Curie temperature of the piezoelectric material. Temperatures above the Curie temperature will result in a loss of the piezoelectric properties of the material. For example, lithium niobate has a Curie temperature of above 1100° C. making a suitable piezoelectric material. Additionally, reactive bonding should be performed at sufficiently low temperatures to avoid thermal distortion and other damage to the piezoelectric and/or diamond layers. Many reactive metals will form carbide bonds at temperatures above about 700° C. Therefore, care must be taken in choosing the reactive metal and piezoelectric material to account for the high temperature effects on the quality and performance of the final product. One advantage of bonding a preexisting piezoelectric blank to the smooth surface of the diamond layer is that the piezoelectric properties of a grown piezoelectric layer are often limited since the crystals must be aligned.

Once the piezoelectric blank is attached, the piezoelectric blank is reduced to the desired thickness using known grinding and polishing methods. Typically in SAW filter applications, the outer surface of the blank will be reduced to produce a piezoelectric layer thickness of less than about 2 micrometers, such as about 1 micrometer. The outer surface of the piezoelectric material after polishing should exhibit a surface suitable for attachment of IDT or other components necessary for the functionality of the final SAW device. It is often desirable to utilize a stainless steel or other metal ring which is fit around the piezoelectric blank by thermal shrinkage. The ring aids in protecting the mold during the thinning or polishing steps and to prevent damage to the thin bonding layer.

In yet another alternative embodiment of the present invention for making SAW devices, the ceramic mold is a piezoelectric material. In this embodiment, a separate step of forming a piezoelectric layer is avoided. Any piezoelectric material may be used as discussed above, however materials which also act as nucleation enhancers and/or are suitable for CVD/PVD deposition or sputtering are preferred such as AlN. Optionally, a separate nucleation enhancer layer may be added as discussed above. A ceramic mold of lithium niobate may also be used as the surface may be polished to a surface roughness of about 3 angstroms. Using lithium niobate also benefits from the use of a nucleation enhancing layer such as a carbide former or micron/nano-crystalline diamond layer having a thickness in the sub-micrometer range. For example, the polishing of the lithium niobate surface may be performed using a nanocrystalline diamond powder, a portion of which is left on the surface as the nucleation enhancing layer. The adynamic diamond layer may then be grown thereon as in other embodiments disclosed herein. Following the diamond growth step, a support layer is bonded to the growth side of the diamond layer. The piezoelectric mold may then be thinned by grinding or polishing or chemically etching to the desired thickness.

In yet another aspect of the present invention, the ceramic mold may be a ceramic wafer of sufficient size to produce multiple SAW devices from a single wafer precursor. Once the adynamic diamond layer is grown, the piezoelectric layer formed, and the support layer is joined the larger wafer precursor may be subdivided into individual SAW devices. Frequently, the thermal expansion coefficients of the diamond layer and the mold are sufficiently different to cause separation of the layers. This is typically not a problem over an area a few millimeters across, however economic mass production generally requires that such components be formed on wafers and then cut from the wafers. Additionally, wafer sizes are commonly up to 6 inches and newer processes utilize wafer sizes of 8 or 12 inches across. Thus, the difference in thermal expansion becomes a greater problem as the wafer size increases.

Therefore, in accordance with another aspect of the present invention, small grooves may be formed on the interface surface of the ceramic mold. The grooves form a grid wherein each subdivided area defines a surface corresponding to a single SAW device. Although a variety of grid sizes may be used, current typical SAW devices are from about 1 mm to about 5 mm across such as about 2 mm across. The grooves may be formed by etching, cutting, or any other known method. As diamond, or piezoelectric material, is deposited thereon the grooves act to anchor the ceramic mold and isolate the thermal expansion differences to each grid area. Thus, as the ceramic mold cools subsequent to the CVD process, the contraction of the mold is limited by the diamond deposited in the grooves. For example, a single crystal piezoelectric $LiNdO_3$ mold can have up to five times the thermal contraction of diamond when cooling from about 900° C. depending on the crystallographic orientation. Although the grooves may be of any depth and width one current embodiment utilizes grooves of about 30 micrometers in width and a depth of about 1 micrometer. One advantage of using this method is that the depth of the groove can be chosen to correspond to the desired thickness of the piezoelectric material although this is not required. For example, the ceramic mold would be made of a suitable piezoelectric material and after joining a substrate to the growth surface of the adynamic layer, the piezoelectric mold may be polished until the diamond deposited in the grooves is exposed. In this embodiment, the remaining piezoelectric material is used in the final product. Additionally, the uniform depth of the grooves helps to ensure a uniform thickness of piezoelectric material across the entire wafer precursor. IDTs or other components may then be attached to the piezoelectric material including and final packaging materials are layered thereon. The final SAW devices may then be separated by cutting using known techniques to produce the final SAW devices which may then be incorporated into various products. Typical SAW device dimensions are about 0.5 mm total thickness, wherein the piezoelectric layer and diamond layer are up to about 30 micrometers.

In another variation of the above method which utilizes grooves in the ceramic mold, a CVD diamond-passive material is deposited in the grooves. Suitable CVD passive materials include any material on which diamond does not form under CVD conditions such as copper, silver, $SiO_2$, $Al_2O_3$, BN, graphite, and mixtures thereof. During the CVD process diamond will form at the interface surface but not on the CVD passive material. Following the completion of the SAW devices thereon, the CVD passive material may be removed by acid dissolution or mechanical force. This variation of the present invention makes separating the individual SAW devices from the wafer precursor much less expensive since no cutting of diamond is required. It should be noted that the use of grooves to produce multiple SAW devices may also be used in the production of the previously described diamond tools. In yet another alternative a CVD passive material is deposited in a pattern which corresponds to individual SAW devices without forming grooves in the surface of the mold.

Referring now to FIGS. 3a–3c, is shown an example of various points in the process of making a cutting element, or insert in accordance with the present invention. FIG. 3a shows metal mold 5, having an interface surface 6, in the inverse shape of a cutting insert, including chip breakers 7, for cutting ductile materials. FIG. 3b shows a diamond or other superabrasive material layer or mass 8, which has been deposited within the mold 5, upon the interface surface 6, using a CVD process. Thus, the layer receives the inverse configuration of the interface surface.

After the diamond layer 8 is deposited upon diamond interface surface 6, it may be thickened to any desired thickness. Such thickening may be accomplished by continuous deposition of diamond by the CVD process, or by using other methods of consolidating and making diamond masses as are known to those of ordinary skill in the art.

As shown in FIG. 3c, following completion of diamond layer 8, the mold 5 is removed, for example by chemical etching, and the diamond layer 8 is joined with non-diamond substrate 10 to form a cutting element. The attachment of diamond layer 8 to non-diamond material 10 may be accomplished by any method known to those skilled in the art, such as gluing, brazing, infiltration, etc.

Of particular note is that working surface 9, is the nucleation surface of diamond layer 8, which was in direct contact with the interface surface 6 of the mold 5. As such, the inverse configuration of the interface surface has been imparted to working surface.

Figure 4:
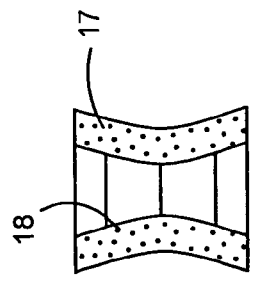
FIG. 4a is a cross section view of a metal mold for fabricating a die, such as a wire drawing dye, or an extrusion dye in accordance with one aspect of the present invention. Further, the metal mold as well as molds with a similar or slightly varied configuration may be used to fabricate nozzles, such as water jet nozzles in accordance with an additional aspect of the present invention.
FIG. 4b is a cross section view of a diamond mass formed on an ephemeral mold for fabricating a die or nozzle in accordance with one aspect of the present invention.
FIG. 4c is a cross section view of a diamond working surface for use in a die or nozzle in accordance with one aspect of the present invention.
FIG. 4d is a cross section view of a diamond die or nozzle formed in accordance with one aspect of the present invention.
Figure 4:
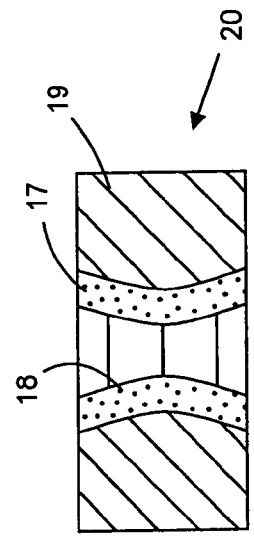
Figure 4:
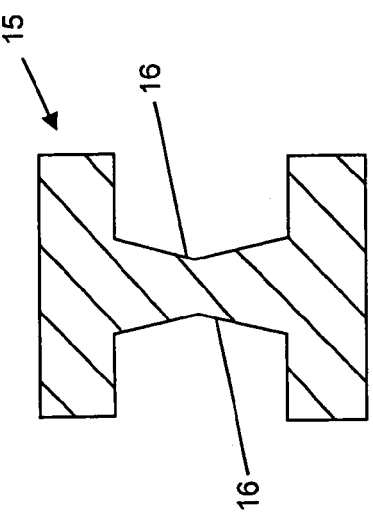
Figure 4:
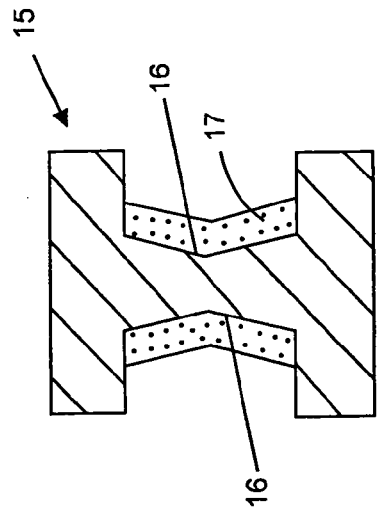

Referring now to FIGS. 4a–4d, there is shown an example of various points in the process for making a die, such as a wire drawing dye or an extrusion dye, in accordance with the present invention. Further, the process and structures represented may be used for making a nozzle, such as a water jet nozzle. FIG. 4a shows a mold 15 having an interface surface 16 inversely configured to impart a desired shape to a die or nozzle. FIG. 4b shows a diamond or other superabrasive material layer 17 deposited upon the interface surface of the mold. The mold is removed, for example by dissolving it with chemicals, and FIG. 4c shows resultant diamond layer, having newly an exposed working surface 18, which was the nucleation surface of the diamond layer, during its formation.

Following the removal of mold 15, a non-diamond mass 19 may be joined to the diamond or other superabrasive material layer 17, using any method known in the art, such as gluing, brazing, infiltrating, or other type of bonding, to join the diamond layer with the non-diamond mass, to form a wire drawing die 20. Additionally, an outer ring of stainless steel, copper, or the like, (not shown) may be placed on the perimeter of non-diamond mass 19, prior to its attachment to diamond layer 17. The space created between diamond layer, and the outer ring is filled with a non-diamond material 19 (e.g. WC grain), and infiltrated (e.g. by a copper alloy) to create a composite tool.

Figure 5:
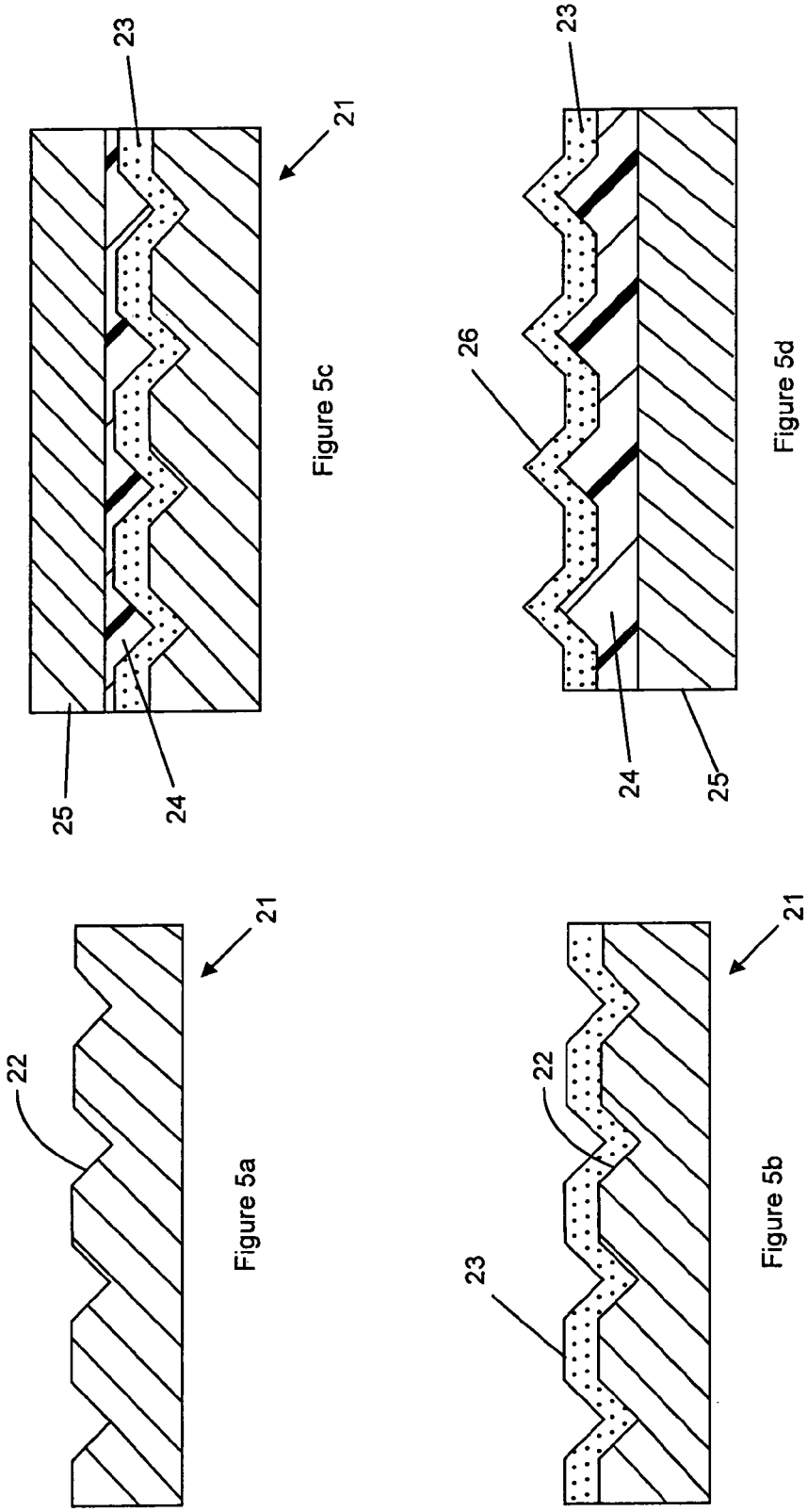
FIG. 5a is a cross section view of a mold for fabricating a diamond CMP pad dresser in accordance with one aspect of the present invention.
FIG. 5b is a cross section view of a diamond mass formed on a mold for fabricating a diamond CMP pad dresser in accordance with one aspect of the present invention.
FIG. 5c is a cross section view of a diamond mass formed on an ephemeral mold having a resin layer joined, to a hard substrate for fabricating a diamond CMP pad dresser in accordance with one aspect of the present invention.
FIG. 5d is a cross section view of a diamond CMP pad dresser with the mold removed, in accordance with one aspect of the present invention.

Referring now to FIGS. 5a–5d there is shown an example of various points in the process for making a chemical mechanical polishing (CMP) pad dresser in accordance with the present invention. FIG. 5a shows a mold 21 made of a suitable material, such as silicon, having an interface surface 22, configured to impart a desired shape to the CMP pad dresser. FIG. 5b shows a diamond or other superabrasive material layer 23 deposited upon the interface surface of the mold, using a CVD technique. As discussed above, the diamond layer may be thickened to any desired thickness, using any of the methods known to one of ordinary skill in the art.

FIG. 5c shows a hard substrate layer 25, which has been joined to the diamond layer 23 by an epoxy layer 24. Attachment of hard substrate layer to the diamond layer may otherwise be accomplished by any method known to those skilled in the art, including sintering, infiltration, etc., as described above. Subsequent or prior to the attachment of the substrate by the epoxy resin layer to the diamond layer, the mold 21 may be removed by a process, such as chemical dissolution with a strong acid, thus exposing the working surface 26 of diamond layer 23, as shown in FIG. 5d. Notably, the working surface was the nucleation surface of the diamond layer during its fabrication, and has a configuration which inversely corresponds to interface surface 22 of the mold.

Figure 6:
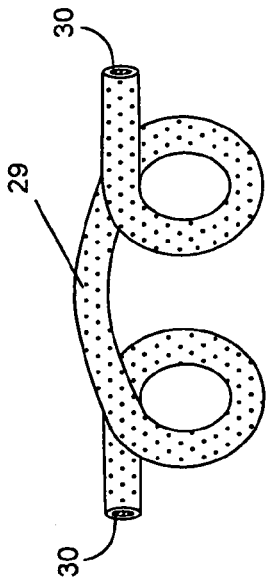
Figure 6:
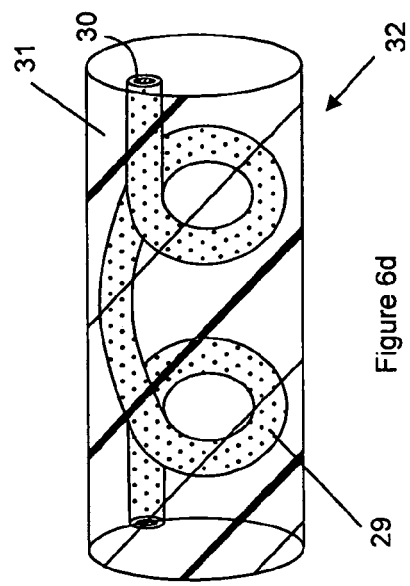
Figure 6:
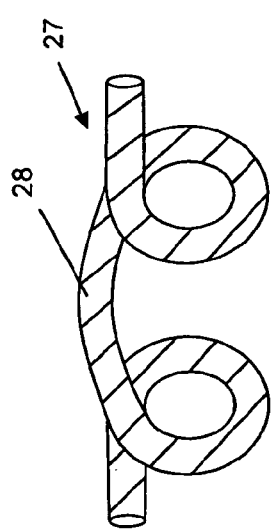
Figure 6:
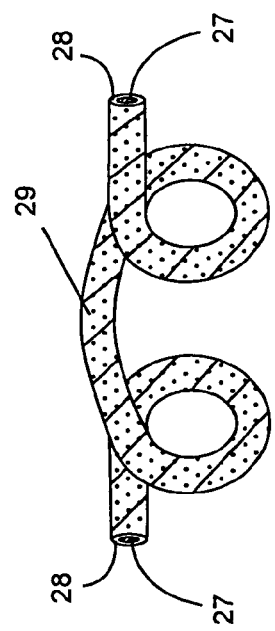

Referring now to FIGS. 6a–6d, there is shown an example of various points in the process for making a diamond or superabrasive pipe in a coiled configuration in accordance with the present invention. FIG. 6a shows a mold 27 in the shape of a coiled wire or pipe, having an interface surface 28. Diamond or another superabrasive material is deposited upon the interface surface using a CVD technique, and FIG. 6b shows the diamond or other superabrasive material layer 29 which is formed on the interface surface of the mold as shown in FIG. 6a. The diamond layer may be thickened to any desired thickness using any of the afore-mentioned methods known in the art of creating diamond masses.

Prior or subsequent to the formation of the diamond layer 29, the mold 27 may be removed by a suitable method such as chemical etching, heating, cooling, or dissolution. The removal of the mold exposes the nucleation surface of the diamond layer, which becomes the working surface 30. Notably, the working surface inversely corresponds to the configuration of the interface layer 28.

After the removal of the mold 27, the diamond layer 29 may be overlaid with a substance, such as acrylic resin 31, to facilitate handling, and a complete diamond pipe 32, as shown in FIG. 6d is produced. Such pipes are useful in the transportation of corrosive and otherwise harmful fluids and gases (e.g. hydrofluoric gas). Further, such pipes are useful for the transportation of sterilized fluid, which may otherwise be corrupted by reaction with a substance which is less inert than diamond.

Referring now to FIGS. 7a through 10d, several embodiments of the present invention are shown for making SAW devices. Typically, the SAW device is a SAW filter, however these principles may also be applied to other similar devices such as phase shifters, amplifiers, convolvers, resonators, and other similar devices. Such components may be of interest in a variety of applications such as filtering, delay lines for paging and wireless devices, mobile switching systems, and other electronic devices.

Referring now to FIGS. 7a–f is shown a process for making a SAW filter 50 in accordance with one aspect of the present invention. Ceramic mold 55 is provided having an interface surface 60, upon which an optional thin nucleation enhancer layer 65 is formed and outside surface 100. As recited above, the interface surface may be polished to an extremely high smoothness for various applications, and the outside surface may be polished or shaped to any configuration required to form a specific tool, when the mold becomes part of the tool as described herein. In FIG. 7c, diamond layer 70 is then grown on the thin nucleation enhancer layer using one of various known CVD processes. The working surface 75 of the diamond layer is the nucleation surface, and is in direct contact with the thin nucleation enhancer layer. The interface surface is configured to inversely match a configuration intended for a working surface 75 of the diamond layer, and because of the thinness of the nucleation enhancer layer, such a configuration is easily transferred thereto. Note that in actual use, the thin nucleation layer is only a few nanometers thick. However, for the purposes of adequate representation in the present drawings, the thin nucleation layer is shown on a much larger scale with respect to the other components than in actual use.

Following formation of the diamond layer 70, the growth side 80 thereof is mounted on or against a substrate 85. The substrate may be of any suitable material as selected by one skilled in the art and may be attached by any mechanism suitable for the specific substrate material chosen. In one aspect, the substrate may be an epoxy or other resin. Either prior to or following attachment to the substrate, and following any polishing or shaping of outside surface 100, if required, a plurality of interdigital transducers 90 (i.e. electrodes) may be mounted on top of the piezoelectric material by any of a variety of mechanisms known to those skilled in the art for such positioning and attachment. Notably, the IDT may also be formed on the interface surface 60, prior to the growth of the diamond layer in certain applications.

As depicted in FIG. 7d, when the ceramic mold 55 is a piezoelectric layer, the thin nucleation enhancer layer 65 may be left in place according to one aspect of the present invention and becomes part of the finished product. However, in accordance with another aspect of the present invention, as depicted in FIGS. 7e–7f, the nucleation enhancer layer and the ceramic mold may be removed by a suitable mechanism as described above, and then a piezoelectric layer and interdigital transducers may be formed upon the working surface 75 of the diamond layer 70. It is to be noted that the ceramic mold and thin nucleation layer may be used with any configuration in order to create any tool otherwise described herein, as well as others that will be readily recognized by those skilled in the art.

Figure 8A:
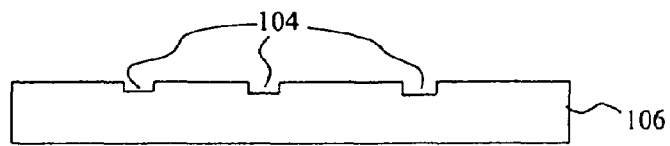
FIG. 8a is a side view of a portion of a ceramic mold for fabricating multiple SAW filters in accordance with one aspect of the present invention.
Figure 8B:
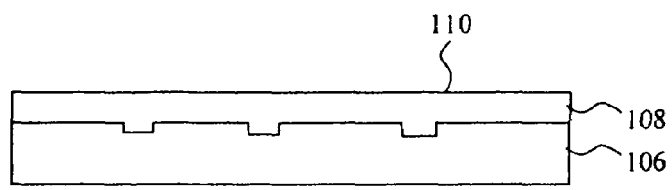
FIG. 8b is a side view of a ceramic mold of FIG. 8a having a thin diamond growth surface layer formed upon an interface surface thereof.
Figure 8C:
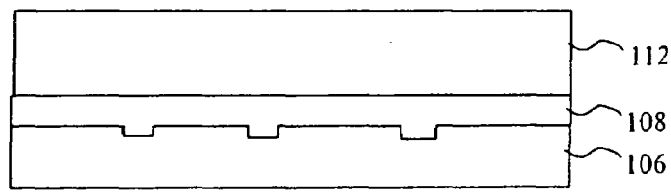
FIG. 8c is a side view of the ceramic mold of FIG. 8b having a support layer joined thereon.
Figure 8D:
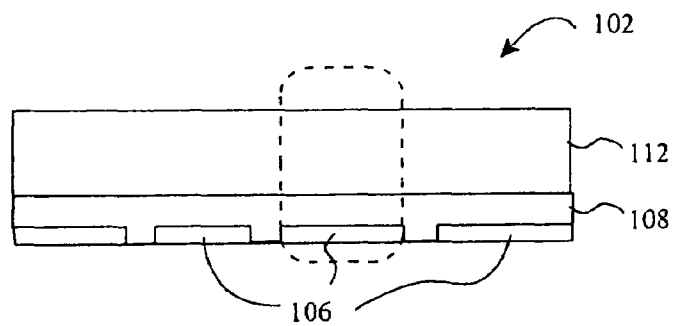
FIG. 8d is a side view of the ceramic mold of FIG. 8c wherein a portion of the ceramic mold has been removed.

FIGS. 8a through 9e depict two embodiments in accordance with the present invention for mass production of SAW devices from precursor wafers, shown generally at 102. As shown in FIG. 8a, a plurality of grooves 104 are formed in the mold 106. The mold can alternatively be a ceramic mold as discussed above in connection with other embodiments. A layer of diamond 108 having growth surface 110 is then formed on the mold 106 as shown in FIG. 8b. This layer may also be preceded by a thin piezoelectric layer as described above, when the mold itself is not a piezoelectric material. The resulting adynamic diamond layer is therefore discontinuous at least at the working surface. FIG. 8c shows a support layer 112 which is then joined to the growth surface 110 of the diamond layer. A portion of the mold 106 is then removed by grinding the mold until the diamond deposited in the grooves 104 is exposed as shown in FIG. 8d. The remaining piezoelectric mold material is thus partitioned into individual and distinct portions corresponding to individual SAW filters. FIG. 8e is a perspective view of the area shown in FIG. 8d by a dashed line. As shown in FIG. 8e, various additional layers can then be added such as IDT pads 114, formed of a material such as aluminum, and/or other packaging materials 115 such as silicon dioxide. Those skilled in the art will recognize other materials and various functional layers which can be formed to design a wide variety of electrical components. The resulting precursor wafer 102 is then subdivided along the grooves by cutting or other methods to produce individual SAW devices 116 either before or after the various additional layers are added.

Figure 8E:
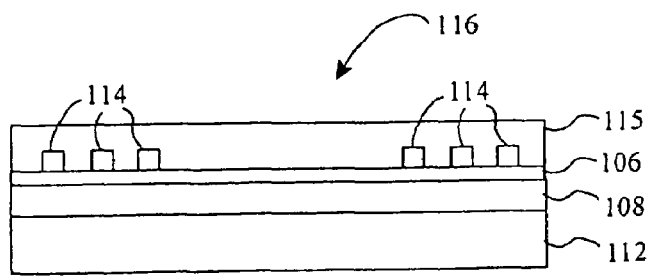
FIG. 8e is a side view of an individual SAW filter produced from the dashed area of the precursor wafer of FIG. 8d.

Alternatively, a piezoelectric layer can be formed on the working surface of the diamond layer as discussed in any of the previous embodiments. Although other dimensions are considered within the scope of the present invention, in one embodiment the thickness of layers 106, 108, and 112 (as shown in FIG. 8e) can be about 0.5 mm, the thickness of layers 106 and 108 can be about 30 micrometers, and the width of the entire device 116 can be about 2 mm. In such a SAW filter, a piezoelectric layer which is grown or deposited on the working surface of the diamond will have a surface roughness nearly identical to that of the working surface on both the surface in contact with the working surface and the surface opposite the working surface.

Figure 9A:
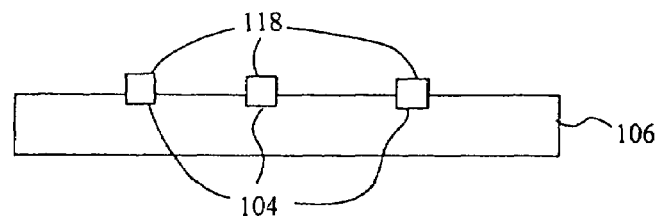
FIG. 9a is a side view of a portion of a ceramic mold for fabricating multiple SAW filters in accordance with one aspect of the present invention.
Figure 9B:
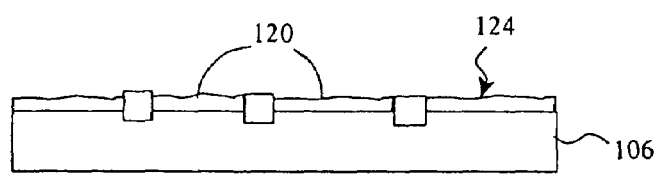
FIG. 9b is a side view of a ceramic mold of FIG. 9a having a thin diamond layer formed upon discrete areas of an interface surface thereof.
Figure 9C:
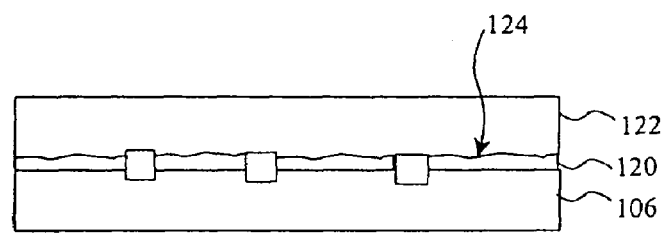
FIG. 9c is a side view of the ceramic mold of FIG. 9b having a support layer joined thereon.
Figure 9D:
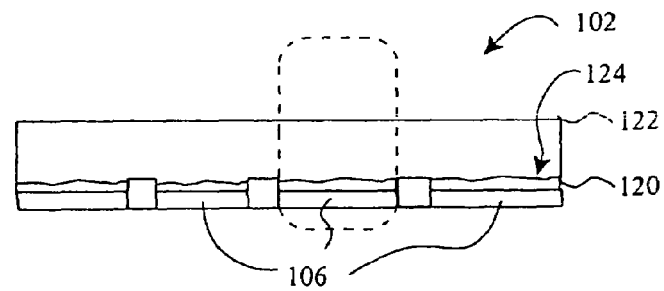
FIG. 9d is a side view of the ceramic mold of FIG. 9c wherein a portion of the ceramic mold has been removed.
Figure 9E:
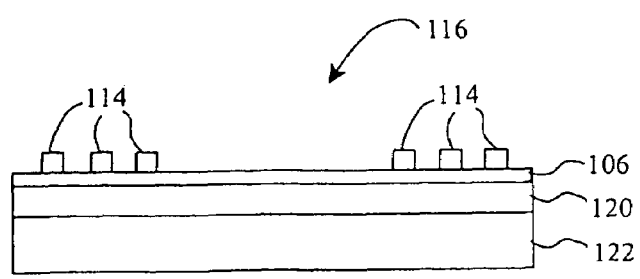
FIG. 9e is a side view of an individual SAW filter produced from the dashed area of the precursor wafer of FIG. 9d.

In an alternative embodiment, FIG. 9a shows a mold 106 having grooves 104 formed therein. The grooves are filled with a CVD passive material 118 such as copper or silver. The mold 106 is then placed in a CVD reactor to form a diamond layer 120 on the areas which are not covered with CVD passive material 118 as depicted in FIG. 9b. FIG. 9c shows a support layer 122 being joined to the growth surface 124 of the diamond layer 120. As shown in FIG. 9d, a portion of the mold 106 is then removed to expose the CVD passive material 118 in the grooves. After forming the necessary components such as IDT pads 114 on the remaining mold portions 106, the precursor wafer 102 is subdivided into individual SAW devices as shown in FIG. 9e which is an enlarged view of the dashed area shown in FIG. 9d. In an alternative embodiment, the mold comprises a piezoelectric material as in previously described embodiments. Thus, the CVD passive material can essentially partition either or both the piezoelectric material and diamond layer depending on when the piezoelectric material is introduced. Further, the piezoelectric material can be formed on the working surface of the diamond subsequent to removal of the mold as discussed above.

In yet another detailed aspect of the present invention, the mold and/or thin piezoelectric layer can be covered with a pattern of CVD passive material. This embodiment can be used in lieu of forming grooves therein or in combination therewith. A variety of methods can be used to form the desired patterns such as standard lithography and/or etching processes which are well known in the art. Typically, the pattern will be a grid wherein each area corresponds to individual devices although other patterns can be used depending on the desired shape of the final product. The CVD passive material can then be optionally removed using chemical or mechanical treatments such as $HNO_3$ leaching, etching or the like. If the CVD passive material is removed from a mold having grooves therein the individual SAW devices can then be separated by merely breaking the mold along the grooves.

Figure 10A:
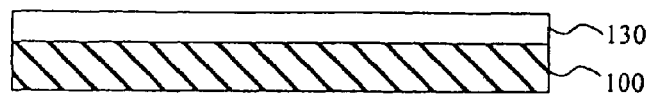
FIG. 10a is a side view of a portion of a mold for fabricating SAW devices and having a layer of CVD passive material deposited thereon in accordance with one aspect of the present invention.
Figure 10B:
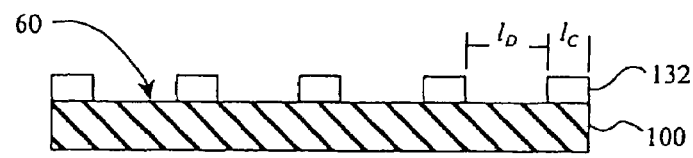
FIG. 10b is a side view of a mold of FIG. 10a having a portion of the CVD passive layer removed.
Figure 10C:
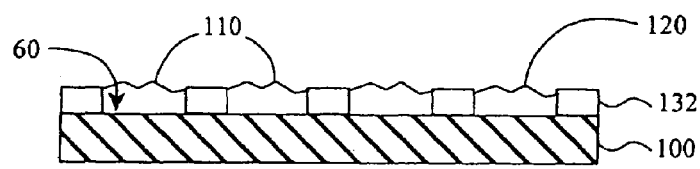
FIG. 10c is a side view of the mold of FIG. 10b having a diamond deposited on the exposed portions of the interface surface of the mold.
Figure 10D:
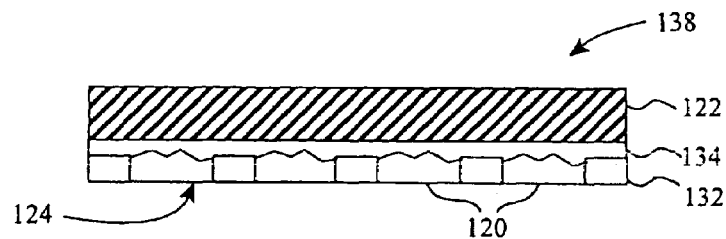
FIG. 10d is a side view of the mold of FIG. 10c wherein a support layer is joined to the growth surface using a braze material and having a portion of the ceramic mold removed.
Figure 10E:
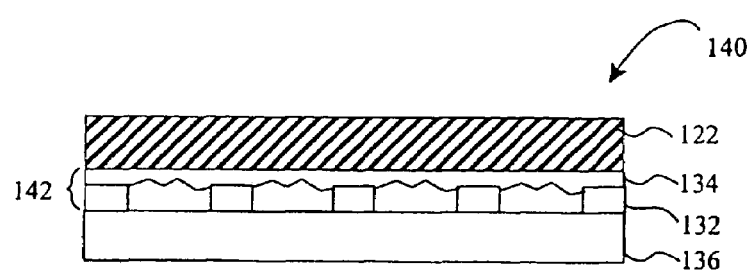
FIG. 10e is a side view of the mold of FIG. 10d having a semiconductor substrate joined thereto.

In yet another embodiment, a pattern of CVD passive material that is formed to define multiple areas configured for forming diamond thereon may be used in a method of mass producing SAW devices. Although other methods can be employed, FIG. 10a shows one method of forming the pattern of CVD passive material is by depositing a layer 130 of CVD passive material such as Cu or Al on the interface surface of the mold 100. Copper is currently the preferred CVD passive material. A portion of the Cu can then be etched away using standard lithographic techniques leaving a pattern of CVD passive material 132. The remaining CVD passive material is in a pattern which preferably is in the form of a grid. The width of the CVD passive grid, $l_c$, and width of the areas which are exposed between the grid lines, $l_D$, are chosen to minimize thermal expansion stress. These widths are chosen based on the following set of equations $$\alpha_D l_D + \alpha_C l_C = \alpha_S l_S$$

$$(n-1)l_D + nl_C = l_S$$

where $\alpha_D$, $\alpha_C$, and $\alpha_S$ correspond to the thermal expansion coefficients of diamond, CVD passive material, and the mold respectively, n is the number of grid subdivisions, and $l_S$ is the width of the mold area. The width of the mold area can correspond to an entire mold substrate such as a silicon wafer, or a portion thereof such that multiple SAW devices can be formed (as shown in FIG. 10e) on a single wafer. In a preferred embodiment the CVD passive material is copper. As shown in FIG. 10c, a thin adynamic diamond layer 120 can then be formed in the same manner as discussed above such that diamond is only formed in the areas of the exposed interface surface 60 of the mold. The mold can optionally include a piezoelectric layer or nucleation enhancing layer as in previously discussed embodiments. As shown in FIG. 10d, a support layer 122 can then be joined to the growth surface 110 of the diamond layer using any of the above described methods. Although a wide variety of materials can be used as the support layer, tungsten is currently most preferred for this embodiment of the present invention. In one aspect, FIG. 10d shows a support layer joined to the growth surface of the diamond by a braze alloy 134. Braze alloys suitable for use in the present invention have been previously identified and in one aspect can be silver alloys such as an Ag—Cu—Sn—Ti alloy. As discussed before, the mold 100 can then be removed. The working surface of the diamond layer is now exposed and typically has a surface roughness of less than about 1 micrometer. In one aspect the thickness of the assembly 138 is about 100 micrometers. In another aspect the width of the assembly can be about 250 micrometers.

Figure 11:
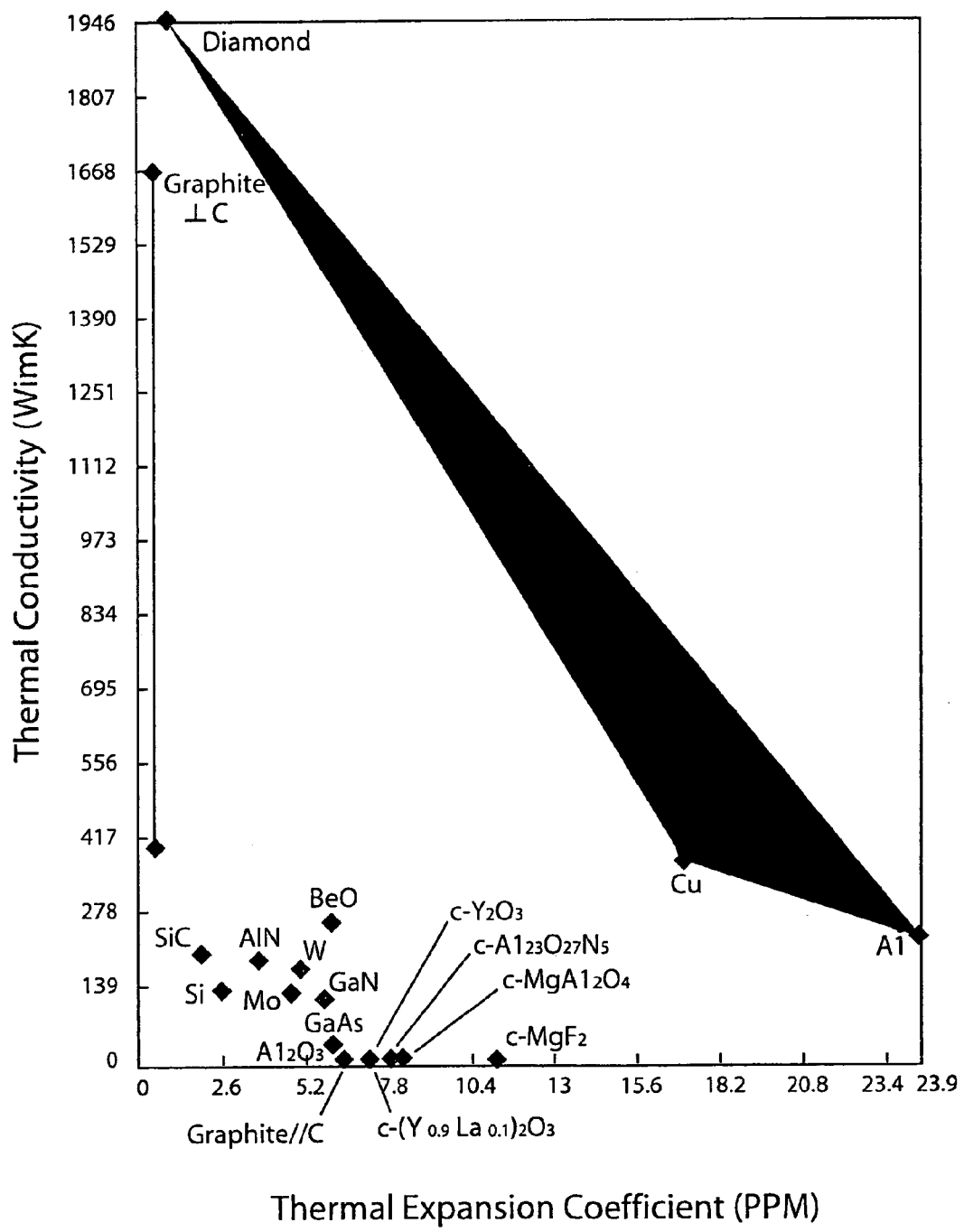
FIG. 11 is a graph plotting thermal expansion coefficients versus thermal conductivity for several materials.

Now referring to FIG. 10e, a semiconductor substrate 136 can then be joined to the working surface of the diamond layer to produce a SAW device 140. In one aspect the semiconductor layer can be brazed to the working surface. Semiconductor layer 136 can comprise any number of materials which are desirable for use in semiconductor devices such as, but not limited to, light emitting diodes or laser diodes. The semiconductor layer can be made of materials such as, but not limited to, GaN, GaAs, $Al_2O_3$, BeO, SiC, Si, AlN, W, Mo, c-$Y_2O_3$, c-$(Y_{0.9}La_{0.1})_2O_3$, c-$Al_{23}O_{27}N_5$c-$MgAl_2O_4$, t-$Mgf_2$, graphite, and mixtures thereof. Reference is made to FIG. 11 which shows a graph of thermal expansion coefficients versus thermal conductivity for several common materials. In the method of the present invention, diamond-containing layer 142, shown in FIG. 10e, has thermal properties which generally fall within the shaded area shown in FIG. 11. As such, the SAW device exhibits improved heat spreading capabilities over typical SAW devices.

The final SAW device contains CVD passive material, which is typically a conductive material, as an electrical conduit between the semiconductor layer and the support layer. One additional benefit of using CVD passive material in this manner substantially decreases the thermal expansion difference between materials. The CVD passive material essentially acts as a thermal expansion break such that any differences are isolated to individual grid areas within the SAW device. Further, the SAW device can be easily cut to a desired size and then attached to an appropriate substrate for use in various semi-conducting devices as is well known in the art.

Figure 12A:
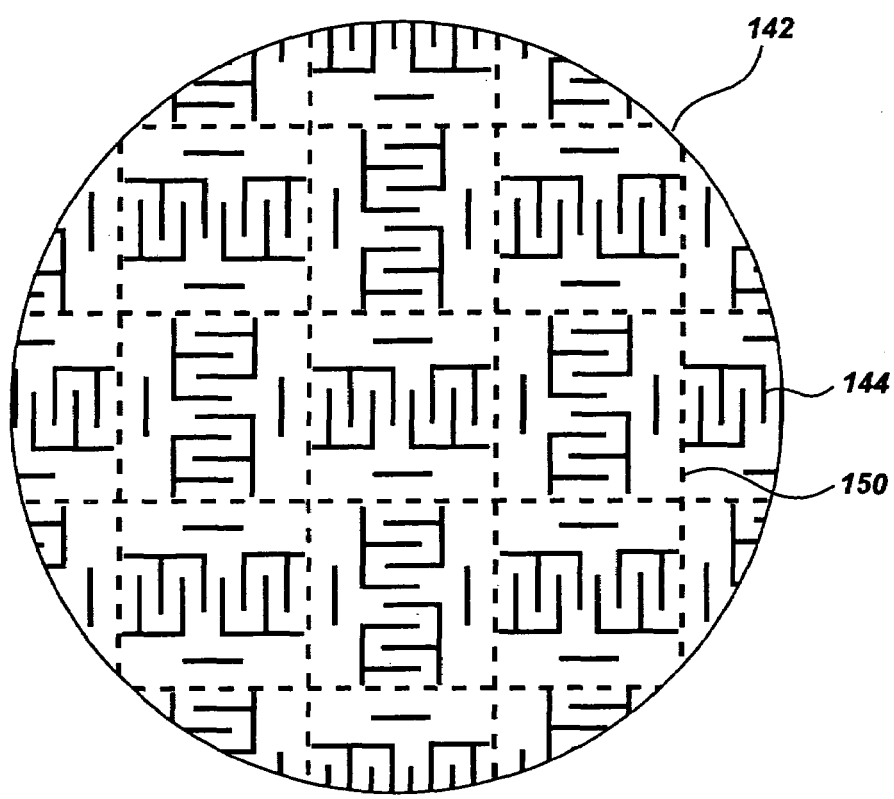
FIG. 12a is a top view of a wafer mold for use in fabricating multiple SAW devices in accordance with an embodiment of the present invention.
Figure 12B:
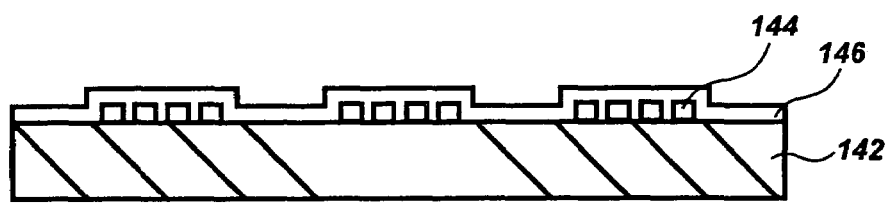
FIG. 12b is a side view of a portion of the mold of FIG. 12a having IDTs formed thereon and a thin piezoelectric layer formed over the IDTs and exposed interface surface.
Figure 12C:
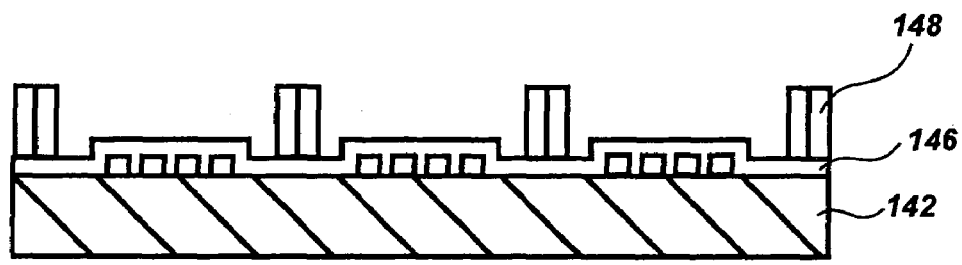
FIG. 12c is a side view of the mold of FIG. 12b having a pattern of CVD passive material formed thereon.
Figure 12D:
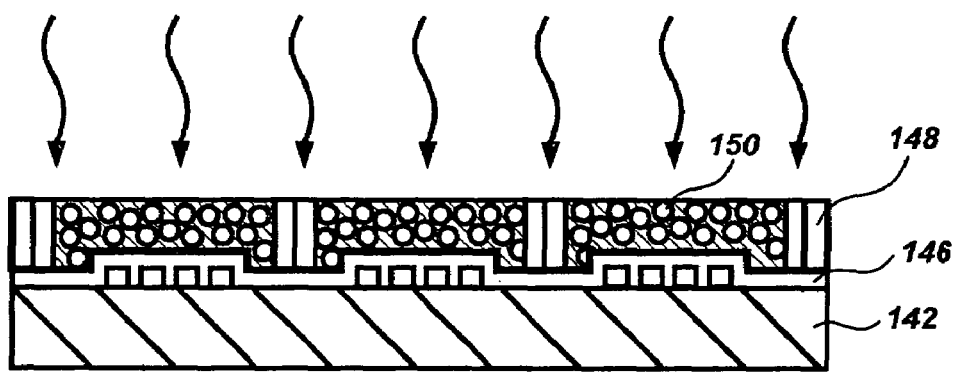
FIG. 12d is a side view of the mold of FIG. 12c having diamond deposited in the areas between the CVD passive material.
Figure 12E:
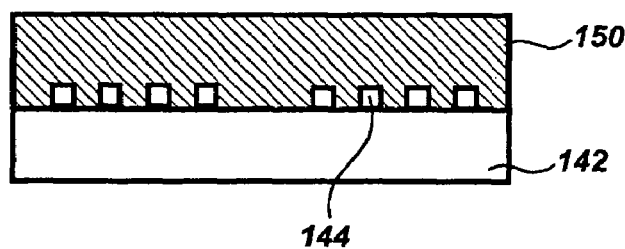
FIG. 12e is a side view of an individual SAW device recovered from the wafer mold of FIG. 12d.

In yet another alternative embodiment, the IDT patterns of a SAW filter or other electrical device can be deposited on a piezoelectric mold interface surface prior to nucleation enhancement and/or diamond growth. FIG. 12a shows a single crystal piezoelectric mold 142 having a pattern of conductive material 144, such as copper, deposited thereon. Those skilled in the art will recognize that other conductive materials can also be deposited and can act as an IDT or other electrical circuit. FIG. 12b shows a side view of a portion of the single crystal of FIG. 12a, wherein an optional nucleation enhancement layer 146 is deposited on the interface surface of the mold 142 and the pattern of conductive material 144. As discussed above, the nucleation enhancing layer can contain carbide formers such as Ti, Cr, W, Mo, Si, and the like. Typical nucleation enhancing layers are about 10 nanometers in thickness although other thicknesses could be used. FIG. 12c shows a pattern of CVD passive material 148, which is passive with respect to diamond deposition, deposited along the dashed lines 150 of FIG. 12a (figures not to scale). The height of the CVD passive material 148 is preferably chosen such that the diamond layer to be deposited is thinner than the height of the CVD passive material. FIG. 12d shows an adynamic diamond layer 150 deposited in the areas between the CVD passive material 148. A support layer can optionally be joined to the growth surface in the same manner as described in previous embodiments. FIG. 12e shows a final SAW filter device which has been separated from the single crystal mold of FIG. 12a along the dashed lines 150 using any number of methods such as dicing, laser, breaking, etc. The SAW device shown in FIG. 12e illustrates how the interface surface can include electrical conducting elements such as IDTs in contrast to the IDTs being located as shown in FIGS. 7e, 7f, 8e, and 9e. In the SAW device of FIG. 12e no additional packing material is required, although such could be added.

Because of the specific diamond materials used for the SAW devices of the present invention, they display certain heat spreading properties. As is well known in the relevant art, heat spreaders are used for dissipating heat away from a surface or area. The thermal conductivity of diamond at room temperature (over about 2000 W/mK) is much higher than either copper (about 400 W/mK) or aluminum (250 W/mK), the two fastest metal heat conductors commonly used. Moreover, the thermal capacity of diamond (1.5 J/cm$^3$) is much lower than copper (17 J/cm$^3$) or aluminum (24 J/cm$^3$). The ability for diamond to carry away heat without storing it makes diamond an ideal heat spreader. In contrast to heat sinks, a heat spreader acts to quickly conduct heat away from a heat source without storing it.

EXAMPLES

Example 1

One side of a 0.7 mm thick silicon wafer is polished to a surface roughness of about 3 angstroms. The polished wafer is then placed in a CVD reactor using tungsten filaments and filled with hydrogen gas containing 1% by volume methane at 40 torr. The silicon wafer is maintained at a temperature of about 900° C. The process maintained for 10 hours, wherein the diamond layer thickness is about 10 micrometers. The silicon wafer is removed from the reactor, whereupon it is noted that the growth surface contains crystalline facets of several microns.

The growth surface of the diamond layer is then brazed to a tungsten support layer having a thickness of 2 mm using a braze foil. The braze foil is an amorphous nickel alloy (available under the tradename MBF-20 from Honeywell). The braze foil is placed between the growth surface of the diamond layer and the support layer and heated to 1010° C. under vacuum for 17 minutes. Upon cooling, a majority of the silicon is removed using a diamond grinding wheel. In order to preserve the smooth working surface of the diamond layer, the remaining silicon is removed using a concentrated solution of potassium hydroxide.

Example 2

The same process as in Example 1, except the mold and support layers were titanium and the braze alloy was Ag—Cu—Ti alloy. A one micron thick layer of ZnO was deposited by sputtering on the working surface of the diamond under vacuum. Next, a one micron thick layer of aluminum was deposited on the ZnO. A portion of the aluminum layer was then etched away to form IDT pads to create a SAW filter. The resulting SAW filter performed well at frequencies above about 2 GHz.

Example 3

Copper plates were polished to an Ra of about 5 nm using an ultrasonic bath of nano-sized diamond particles. After drying, the plates were placed in a CVD reactor and a diamond film of about 10 microns were deposited as described in Example 1. As the copper cools the thin diamond layer peels from the copper mold. A braze foil of 0.001 inches thick (MBF-20 as in Example 1) is placed on a tungsten support layer. The thin diamond layer is then pressed against the braze foil using a stainless steel block sprayed with boron nitride powder to form an assembly. The assembly is then heated to 1010° C. for about 8 minutes under vacuum of 10$^{-5}$ torr.

Example 4

A 6 inch diameter silicon wafer was polished to a mirror finish by diamond fines and then cut into 2 cm squares to produce multiple silicon molds. The squares are placed in a CVD reactor on a tray positioned about 8 mm below a set of tungsten filaments. The reactor is then heated to about 900° C. The reactor chamber is subsequently permeated with hydrogen gas containing about 1% methane at 80 torrs. After 10 hours, the silicon molds are removed from the reactor chamber. A thin diamond film (about 8 microns) covered the polished silicon molds.

Two of the squares are treated with hydrofluoric acid to dissolve the silicon mold. The recovered thin diamond films become curved. The remaining diamond films are then brazed onto a flat plate of cemented tungsten carbide by using a silver, copper, and titanium braze alloy. The brazing is performed in a vacuum furnace at 940° C. for 10 minutes. After recovery of the brazed assemblies, the silicon molds are then removed by chemical etching. The results are flat diamond films with a high finish that mirrors the original surface of the polished silicon. However, the diamond film on one of the disk has developed cracks at the center, presumably due to the thermal stress imposed by the shrinking WC substrate.

Example 5

The same process as in Example 4, except polished fused silica is used as the mold. In this case, a flash of silicon of a few tens of nanometers was deposited on the polished surface by using a CVD reactor that contains a silane and hydrogen atmosphere. The gas was heated to a plasma state by using a radio frequency capacitor. The silicon coated fused silica mold is then used to deposit a thin CVD diamond layer in the hot filament reactor as described in Example 4. Subsequently, the growth surface of the thin diamond layer is bonded to a silicon substrate. After removing the mold, the thin diamond film is flat and smooth and does not exhibit micro-cracks as in Example 4. Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of making a diamond surface acoustic wave (SAW) device comprising the steps of:
   a) providing a mold having an interface surface configured to inversely match a configuration intended for a working surface of the diamond SAW device;
   b) growing an adynamic diamond layer on the mold using a CVD technique, said adynamic diamond layer having a growth surface opposite the working surface;
   c) joining a support layer to the growth surface of the adynamic diamond layer; and
   d) removing at least a portion of the mold.

2. The method of claim 1, wherein the mold is a ceramic mold made substantially of a material selected from the group consisting of: $SiO_2$, $Al_2O_3$, $LiTaO_3$, $LiNbO_3$, ZnO, langaside, lead zirconium titanate, glass, $Si_3N_4$, AlN, BN, TiN, ZrN, and mixtures thereof.

3. The method of claim 1, wherein the mold comprises a piezoelectric material.

4. The method of claim 3, wherein the piezoelectric material is AlN.

5. The method of claim 3, wherein the piezoelectric material is $LiNbO_3$.

6. The method of claim 3, wherein the piezoelectric material is provided from a single crystal ingot.

7. The method of claim 3, further comprising the step of thinning the piezoelectric material to a thickness of less than about 2 micrometers, subsequent to the step of joining the support layer to the growth surface.

8. The method of claim 1, wherein the mold comprises a carbide former.

9. The method of claim 8, wherein the carbide former is a member selected from the group consisting of Ta, Zr, Si, Ti, Cr, Mo, W, Mn, and mixtures thereof.

10. The method of claim 1, wherein the mold comprises a CVD passive material selected from the group consisting of copper, silver, $SiO_2$, $Al_2O_3$, and mixtures thereof.

11. The method of claim 1, wherein the step of joining the support layer to the growth surface is accomplished by brazing with a braze alloy containing a carbide forming agent.

12. The method of claim 11, wherein said support layer comprises a member selected from the group consisting of tungsten, silicon, $Si_3N_4$, SiC, BN, graphite, and mixtures thereof.

13. The method of claim 11, wherein said carbide forming agent is a member selected from the group consisting of Ti, Cr, Si, Zr, Mn, and mixtures thereof.

14. The method of claim 1, further comprising the step of forming a thin piezoelectric layer on the working surface of the diamond subsequent to the step of removing the mold.

15. The method of claim 14, wherein the step of forming the thin piezoelectric layer is accomplished by deposition from a vapor phase using a CVD or PVD process.

16. The method of claim 14, wherein the step of forming the thin piezoelectric layer is accomplished by bonding a piezoelectric material to the working surface using either an organic binder layer or reactive bonding layer.

17. The method of claim 16, wherein the organic binder layer or reactive bonding layer has a final thickness less than about 1 micron.

18. The method of claim 17, wherein the organic binder layer comprises an epoxy.

19. The method of claim 17, wherein the reactive bonding layer includes a reactive metal selected from the group consisting of Ti, Si, Zr, Cr, Mo, W, Mn, and mixtures thereof.

20. The method of claim 14, further comprising the step of thinning the piezoelectric material to a thickness of less than about 2 micrometers subsequent to forming the thin piezoelectric layer on the working surface.

21. The method of claim 1, further comprising the step of forming a thin piezoelectric layer on the interface surface of the mold prior to growing the adynamic diamond layer thereon.

22. The method of claim 21, wherein the piezoelectric layer comprises a member selected from the group consisting of AlN, ZnO, $LiNbO_3$, and mixtures thereof.

23. The method of claim 22, wherein the mold comprises a member selected from the group consisting of Si, W, Ti, Cr, Zr, Mo, Mn, and mixtures thereof.

24. The method of any of claims 3, 14, or 21, wherein the piezoelectric material is a member selected from the group consisting of $SiO_2$, $Si_3N_4$, $Al_2O_3$, AlN, GaAs, GaP, $LiTaO_3$, $LiNbO_3$, ZnO, $Pb(Zr,Ti)O_3$, $Ta_2O_5$, $Nb_2O_5$, BeO, $Li_2B_4O_7$, $KNbO_3ZnS$, ZnSe, CdS, PZT, $Bi_4Ge_3O_{13}$, $La_3Ga_5SiO_{14}$, $YVO_4$, and mixtures thereof.

25. The method of claim 24, wherein the piezoelectric material is AlN or $LiNbO_3$.

26. The method of any of claims 3, 14, or 21, further comprising the steps of:

a) thinning the piezoelectric material by polishing an outside surface of the piezoelectric material; and
b) forming a plurality of interdigital transducers on the outside surface.

27. The method of claim 1, further comprising the step of forming a nucleation enhancing layer on the interface surface of the mold prior to the step of growing the adynamic diamond layer.

28. The method of claim 27, wherein the step of forming a nucleation enhancing layer includes forming microscratches on the interface surface of the mold.

29. The method of claim 27, wherein the nucleation enhancing layer has a thickness of less than about 0.1 micrometers.

30. The method of claim 27, wherein the nucleation enhancer is made substantially of a material selected from the group consisting of: diamonds, metals, metal alloys, metallic compounds, carbides, carbide formers, and mixtures thereof.

31. The method of claim 30, wherein the nucleation enhancer comprises a carbide former selected from the group consisting of Ta, Zr, Si, W, Mo, Cr, Ti, Mn, and mixtures thereof.

32. The method of claim 30, wherein the nucleation enhancer is made substantially of micron or nano-sized diamond particles.

33. The method of claim 1, wherein the SAW device is a SAW filter.

34. The method of claim 33, wherein the SAW filter is incorporated into a telecommunications device.

35. The method of claim 33, wherein the SAW filter is incorporated into a mobile phone.

36. The method of claim 1, wherein the SAW device is a weight measuring device.

37. The method of claim 1, wherein the SAW device is a sensor device for measuring absorbed gas.

38. The method of claim 1, wherein step of removing is accomplished by chemical etching.

39. The method of claim 1, wherein the interface surface has a surface roughness (Ra) of less than about 1 micrometer and wherein the working surface of the diamond produced has a surface roughness (Ra) of less than about 1 micrometer.

40. The method of claim 39, wherein each surface roughness (Ra) is less than about 1 nanometer.

41. The method of claim 1, wherein the thin diamond layer has a thickness of less than about 30 micrometers.

42. The method of claim 1, further comprising the step of attaching said support layer to a substrate for incorporation into a product.

43. The method of claim 1, further comprising the step of forming grooves in the mold, that defines multiple areas which correspond to individual SAW devices, such that the grooves have a depth which corresponds to a desired piezoelectric layer thickness.

44. The method of claim 43, wherein said mold comprises a piezoelectric material.

45. The method of claim 43, wherein the working surface of the diamond is discontinuous.

46. The method of claim 43, further comprising the step of removing a portion of the piezoelectric mold which extends beyond the grooves to produce an outer surface of the piezoelectric layer after the step of joining the support surface, such that the working surface of the diamond layer and the outer surface of the mold are parallel and the portion of piezoelectric mold remaining is partitioned along the multiple areas.

47. The method of claim 43, further comprising the step of filling at least a portion of the grooves with a CVD passive layer prior to growing the adynamic diamond layer on the mold.

48. The method of claim 47, wherein the CVD passive layer is Cu, Ag, BN, $SiO_2$, $Al_2O_3$, graphite, and mixture thereof.

49. The method of claim 1, further comprising the step of forming a pattern of CVD passive material that defines multiple areas which correspond to individual SAW devices.

50. The method of any of claims 46, 47, or 49, further comprising the step of separating individual diamond segments for use in a SAW device.

51. The method of claim 1, further comprising the step of forming a pattern of CVD passive material that defines multiple areas configured for forming diamond thereon, wherein a thickness of the CVD passive material and size of the multiple areas are chosen to minimize thermal expansion stress.

52. The method of claim 51, wherein the CVD passive material is copper.

53. The method of claim 51, further comprising the step of brazing a semiconductor substrate to the working surface of the diamond layer using a braze alloy subsequent to the removal of the mold.

54. The method of claim 53, wherein the braze alloy is an Ag alloy.

55. A method of making a surface acoustic wave (SAW) filter comprising the steps of:
a) providing a mold having an interface surface configured to inversely match a configuration intended for a working surface of the diamond SAW filter and a piezoelectric layer;
b) forming a thin piezoelectric layer on the interface surface of the mold, wherein the piezoelectric layer is a member selected from the group consisting of $SiO_2$, $Si_3N_4$, $Al_2O_3$, AlN, GaAs, GaP, $LiTaO_3$, $LiNbO_3$, ZnO, $Pb(Zr, Ti)O_3$, $Ta_2O_5$, $Nb_2O_5$, BeO, $Li_2B_4O_7$, $KNbO_3$, ZnS, ZnSe, CdS, PZT, $Bi_4Ge_3O_{13}$, $La_3Ga_5SiO_{14}$, $YVO_4$, and mixtures thereof;
c) growing an adynamic diamond layer on the thin piezoelectric layer using a CVD technique, wherein the adynamic diamond layer includes a growth surface opposite the working surface;
d) joining a support layer to the growth surface of the adynamic diamond layer by brazing using a braze alloy containing a carbide former, wherein said support layer is a member selected from the group consisting of W, Si, SiC, Ti, and $Si_3N_4$;
e) removing at least a portion of the mold;
f) thinning the piezoelectric material by polishing an outside surface of the piezoelectric material; and
g) forming a plurality of interdigital transducers on the outside surface.

56. A method of making a surface acoustic wave (SAW) filter comprising the steps of:
a) providing a ceramic mold having an interface surface configured to inversely match a configuration intended for a working surface of the SAW filter, wherein said ceramic mold is a piezoelectric material selected from the group consisting of $SiO_2$, $Si_3N_4$, $Al_2O_3$, AlN, GaAs, GaP, $LiTaO_3$, $LiNbO_3$, ZnO, $Pb(Zr, Ti)O_3$, $Ta_2O_5$, $Nb_2O_5$, BeO, $L_2B_4O_7$, $KNbO_3$, ZnS, ZnSe, CdS, PZT, $Bi_4Ge_3O_{13}$, $La_3Ga_5SiO_{14}$, $YVO_4$, and mixtures thereof;
b) forming a nucleation enhancing layer on the interface surface of the ceramic mold;

c) growing an adynamic diamond layer on the ceramic mold using a CVD technique, wherein the adynamic diamond layer includes a growth surface opposite the working surface;
   d) joining a support layer to the growth surface of the adynamic diamond layer by brazing using a braze alloy containing a carbide former; and
   e) thinning the piezoelectric mold to a thickness of less than about 2 micrometers subsequent to joining the support layer.

57. A method of making a surface acoustic wave (SAW) filter comprising the steps of:
   a) providing a mold having an interface surface configured to inversely match a configuration intended for a working surface of the diamond SAW filter;
   b) growing an adynamic diamond layer on the mold using a CVD technique, wherein the adynamic diamond layer includes a growth surface opposite the working surface;
   c) joining a support layer to the growth surface of the adynamic diamond layer by brazing using a braze alloy containing a carbide former;
   d) removing the mold;
   e) bonding a piezoelectric material to the working surface using a reactive bonding layer having a thickness of less than about 10 nanometers, wherein the reactive bonding layer includes a member selected from the group consisting of Ti, Si, W, Zr, Mo, Cr, Mn, and mixtures thereof, said piezoelectric material being selected from the group consisting of: $SiO_2$, $Si_3N_4$, $Al_2O_3$, AlN, GaAs, GaP, $LiTaO_3$, $LiNbO_3$, ZnO, Pb(Zr, Ti)$O_3$, $Ta_2O_5$, $Nb_2O_5$, BeO, $L_2B_4O_7$, $KNbO_3$, ZnS, ZnSe, CdS, PZT, $Bi_4Ge_3O_{13}$, $La_3Ga_5SiO_{14}$, $YVO_4$, and mixtures thereof; and
   f) thinning the piezoelectric material to a thickness of less than about 2 micrometers to form a thin piezoelectric layer on the working surface.

58. A method of making a surface acoustic wave (SAW) filter comprising the steps of:
   a) providing a mold having an interface surface configured to inversely match a configuration intended for a working surface of the diamond SAW filter;
   b) growing an adynamic diamond layer on the mold using a CVD technique, wherein the adynamic diamond layer includes a growth surface opposite the working surface;
   c) joining a support layer to the growth surface of the adynamic diamond layer by brazing using a braze alloy containing a carbide former;
   d) removing the mold; and
   e) forming a thin layer of piezoelectric material to the working surface using using a CVD or PVD technique.

* * * * *